(12) United States Patent
Qing et al.

(10) Patent No.: US 12,417,741 B2
(45) Date of Patent: Sep. 16, 2025

(54) ARRAY SUBSTRATE AND DISPLAY DEVICE

(71) Applicants: CHENGDU BOE OPTOELECTRONICS TECHNOLOGY CO., LTD., Sichuan (CN); BOE TECHNOLOGY GROUP CO., LTD., Beijing (CN)

(72) Inventors: Haigang Qing, Beijing (CN); Liangfeng Mou, Beijing (CN); Ming Hu, Beijing (CN); Haijun Qiu, Beijing (CN)

(73) Assignees: Chengdu BOE Optoelectronics Technology Co., Ltd., Sichuan (CN); BOE Technology Group Co., Ltd., Beijing (CN)

( * ) Notice: Subject to any disclaimer, the term of this patent is extended or adjusted under 35 U.S.C. 154(b) by 0 days.

(21) Appl. No.: 18/843,127

(22) PCT Filed: Oct. 23, 2023

(86) PCT No.: PCT/CN2023/125969
§ 371 (c)(1),
(2) Date: Aug. 30, 2024

(87) PCT Pub. No.: WO2024/093702
PCT Pub. Date: May 10, 2024

(65) Prior Publication Data
US 2025/0201190 A1    Jun. 19, 2025

(30) Foreign Application Priority Data
Nov. 4, 2022   (CN) .......................... 202211378086.2

(51) Int. Cl.
*G09G 3/3233*   (2016.01)
*G09G 3/3266*   (2016.01)

(52) U.S. Cl.
CPC ......... *G09G 3/3233* (2013.01); *G09G 3/3266* (2013.01); *G09G 2300/0426* (2013.01);
(Continued)

(58) Field of Classification Search
CPC ......... G09G 2300/0426; G09G 3/3233; G09G 2300/0842; G09G 2300/0819
See application file for complete search history.

(56) References Cited

U.S. PATENT DOCUMENTS 10,304,920 B2 *   5/2019   Choi .................. H10D 30/6723
2021/0319754 A1 * 10/2021   Shang ................. G09G 3/3258
(Continued)

FOREIGN PATENT DOCUMENTS

CN   1567031 A    1/2005
CN   111403465 A  7/2020
(Continued)

*Primary Examiner* — Van N Chow
(74) *Attorney, Agent, or Firm* — The Webb Law Firm

(57) ABSTRACT

An array substrate includes a substrate, pixel driving circuits and conductive patterns. In each pixel driving circuit, a first electrode region of a driving transistor, a second electrode region of a data writing transistor and a second electrode region of a first light-emitting control transistor are connected through a conductive connection pattern. The pixel driving circuits are configured as odd-numbered row circuit groups and even-numbered row circuit groups. The odd-numbered row circuit groups and the even-numbered row circuit groups each include pixel driving circuits. An overlapping area of orthographic projections, of the substrate, of a conductive connection pattern and a conductive pattern in at least one pixel driving circuit in an odd-numbered row circuit group is less than an overlapping area of orthographic projections, on the substrate, of a conductive connection pattern and a conductive pattern in at least one pixel driving circuit in an even-numbered row circuit group.

20 Claims, 20 Drawing Sheets

(52) U.S. Cl.
CPC ............... *G09G 2300/043* (2013.01); *G09G 2300/0819* (2013.01); *G09G 2310/08* (2013.01)

(56) References Cited

U.S. PATENT DOCUMENTS

| | | | |
|---|---|---|---|
| 2022/0037370 A1 | 2/2022 | Wu et al. | |
| 2022/0310771 A1* | 9/2022 | Shang | H10K 71/00 |
| 2022/0320213 A1* | 10/2022 | Shang | H10K 59/123 |
| 2022/0320225 A1* | 10/2022 | Yu | H10K 59/131 |
| 2024/0196683 A1* | 6/2024 | Shang | H10K 59/131 |
| 2025/0008773 A1* | 1/2025 | Lu | H10K 59/1201 |
| 2025/0089503 A1* | 3/2025 | Xu | G09G 3/3241 |
| 2025/0098468 A1* | 3/2025 | Zhou | H10K 59/131 |

FOREIGN PATENT DOCUMENTS

| | | |
|---|---|---|
| CN | 113920934 A | 1/2022 |
| CN | 114530464 A | 5/2022 |
| CN | 115911056 A | 4/2023 |

* cited by examiner

ARRAY SUBSTRATE AND DISPLAY DEVICE

CROSS-REFERENCE TO RELATED APPLICATIONS

This application is the United States national phase of International Patent Application No. PCT/CN2023/125969, filed Oct. 23, 2023, and claims priority to Chinese Patent Application No. 202211378086.2, filed Nov. 4, 2022, the disclosures of which are hereby incorporated by reference in their entireties.

BACKGROUND OF THE INVENTION

Field of the Invention

The present disclosure relates to the field of display technologies, and in particular, to an array substrate and a display device.

Description of Related Art

With the maturity of active-matrix organic light-emitting diode (AMOLED) technology, more and more terminals use AMOLEDs as display panels. For gaming products, the market demand for high frame rate (90 Hz and 120 Hz) AMOLED screens is becoming more and more urgent.

SUMMARY OF THE INVENTION

In an aspect, an array substrate is provided. The array substrate includes: a substrate and a plurality of pixel driving circuits disposed on the substrate, each pixel driving circuit of the plurality of pixel driving circuits includes transistors, and the transistors include a driving transistor, a data writing transistor and a first light-emitting control transistor. The array substrate further includes: first electrode regions and second electrode region of the transistors; a first electrode region of the driving transistor, a second electrode region of the data writing transistor and a second electrode region of the first light-emitting control transistor are connected through a conductive connection pattern, and the conductive connection pattern is a continuous pattern.

The plurality of pixel driving circuits are configured as: odd-numbered row circuit groups and even-numbered row circuit groups; the odd-numbered row circuit groups and the even-numbered row circuit groups each include pixel driving circuits arranged in a first direction; the odd-numbered row circuit groups and the even-numbered row circuit groups are alternately arranged in a second direction; the first direction and the second direction intersect.

The array substrate further includes conductive patterns; the conductive patterns include a pattern in the pixel driving circuit that is located in a different layer from the conductive connection pattern. An overlapping area of orthographic projections, on the substrate, of a conductive connection pattern and a conductive pattern in at least one pixel driving circuit in an odd-numbered row circuit group is less than an overlapping area of orthographic projections, on the substrate, of a conductive connection pattern and a conductive pattern in at least one pixel driving circuit in an even-numbered row circuit group.

In some embodiments, the transistors further include a compensation transistor. The array substrate further includes: a gate pattern of the compensation transistor and second scan signal lines; the gate pattern of the compensation transistor is electrically connected to a second scan signal line; a second electrode region of the compensation transistor is connected to a second electrode region of the driving transistor. The plurality of pixel driving circuits are further configured as: a plurality of pixel group units sequentially arranged in the second direction; each pixel group unit of the plurality of pixel group units includes: an odd-numbered row circuit group and an even-numbered row circuit group arranged adjacent to the odd-numbered row circuit group; each pixel group unit shares one second scan signal line.

In some embodiments, the array substrate further includes: a first semiconductor layer disposed on the substrate, the conductive connection pattern being located in the first semiconductor layer.

In some embodiments, the array substrate further includes: a shielding layer located on the substrate, and a first semiconductor layer disposed on a side of the shielding layer away from the substrate. The conductive pattern is located in the shielding layer.

In some embodiments, the array substrate further includes: a first gate conductive layer disposed on a side of the first semiconductor layer away from the substrate, and a second gate conductive layer disposed on a side of the first gate conductive layer away from the substrate. The pixel driving circuit further includes: a capacitor and a compensation transistor. The capacitor includes a first plate and a second plate; the first plate is located in the first gate conductive layer, and the second plate is located in the second gate conductive layer; the first plate is electrically connected to a first electrode region of the compensation transistor, and the second plate is electrically connected to a power supply signal line. The conductive pattern includes: a first portion located in the shielding layer and a second portion electrically connected to the second plate.

In some embodiments, the array substrate further includes: a first gate conductive layer disposed on a side of the first semiconductor layer away from the substrate, and a second gate conductive layer disposed on a side of the first gate conductive layer away from the substrate. The conductive pattern is located in the second gate conductive layer.

In some embodiments, an area of an orthographic projection, on the substrate, of the conductive pattern in the odd-numbered row circuit group is equal to an area of an orthographic projection, on the substrate, of the conductive pattern in the even-numbered row circuit group. In the even-numbered row circuit group, the conductive connection pattern is connected to a first extension pattern located in the first semiconductor layer, and the orthographic projection, on the substrate, of the conductive pattern covers an orthographic projection, on the substrate, of the first extension pattern.

In some embodiments, the display panel further includes a second gate conductive layer disposed on a side of the first semiconductor layer away from the substrate. The array substrate further includes second scan signal lines, the second scan signal lines being located in the second gate conductive layer. A conductive pattern and a second scan signal line are of a one-piece structure.

In some embodiments, the array substrate further includes: a first source-drain metal layer disposed on a side of the first semiconductor layer away from the substrate, the first source-drain metal layer includes third extension patterns, and a third extension pattern is connected to the conductive connection pattern through a via hole. The array substrate further includes: a second source-drain metal layer disposed on a side of the first source-drain metal layer away from the substrate, and the second source-drain metal layer includes power supply signal lines. A conductive pattern and a power supply signal line are of a one-piece structure. An overlapping area of orthographic projections, on the substrate, of a third extension pattern and the conductive pattern in the odd-numbered row circuit group is less than an overlapping area of orthographic projections, on the substrate, of a third extension pattern and the conductive pattern in the even-numbered row circuit group.

In some embodiments, in the odd-numbered row circuit group, an orthographic projection of a power supply signal line on the substrate does not overlap with an orthographic projection of the third extension pattern on the substrate.

In some embodiments, an orthographic projection of the third extension pattern on the substrate overlaps with an orthographic projection of the conductive connection pattern on the substrate.

In some embodiments, the transistors include: a first reset transistor, a compensation transistor, a second light-emitting control transistor and a second reset transistor. The array substrate further includes: first initial signal lines, second initial signal lines, data signal lines and power supply signal lines. A first electrode region of the first reset transistor is electrically connected to a first initial signal line, a second electrode region of the first reset transistor is electrically connected to a first electrode region of the compensation transistor, and a second electrode region of the compensation transistor is electrically connected to a second electrode region of the driving transistor; a first electrode region of the second light-emitting control transistor is electrically connected to the second electrode region of the driving transistor, a second electrode region of the second light-emitting control transistor is electrically connected to a second electrode region of the second reset transistor, and a first electrode region of the second reset transistor is electrically connected to a second initial signal line; a first electrode region of the data writing transistor is electrically connected to a data signal line; and a first electrode region of the first light-emitting control transistor is electrically connected to a power supply signal line.

In some embodiments, the array substrate further includes: a gate pattern of the first reset transistor, reset signal lines, a gate pattern of the second reset transistor, first scan signal lines, a gate pattern of the first light-emitting control transistor, a gate pattern of the second light-emitting control transistor, and light-emitting control signal lines. The gate pattern of the first reset transistor is electrically connected to a reset signal line, the gate pattern of the second reset transistor is electrically connected to a first scan signal line, and the gate pattern of the first light-emitting control transistor and the gate pattern of the second light-emitting control transistor are electrically connected to the light-emitting control signal line.

In some embodiments, the array substrate further includes: a first semiconductor layer disposed on a side of the substrate, the conductive connection pattern being located in the first semiconductor layer; a first gate conductive layer disposed on a side of the first semiconductor layer away from the substrate, the first scan signal lines and the light-emitting control signal lines being located in the first gate conductive layer; a second gate conductive layer disposed on a side of the first gate conductive layer away from the substrate, the first initial signal lines and the reset signal lines being located in the second gate conductive layer; a first source-drain metal layer disposed on a side of the second gate conductive layer away from the substrate, the second initial signals being located in the first source-drain metal layer; and a second source-drain metal layer disposed on a side of the first source-drain metal layer away from the substrate, the data signal lines and the power supply signal lines being located in the second source-drain metal layer.

In some embodiments, the compensation transistor and the first reset transistor are oxide thin film transistors. The array substrate further includes: a second semiconductor layer and a third gate conductive layer disposed between the second gate conductive layer and the first source-drain metal layer, the third gate conductive layer being disposed on a side of the second semiconductor layer away from the substrate.

In another aspect, an array substrate is provided. The array substrate includes a substrate and a plurality of pixel driving circuits disposed on the substrate, each pixel driving circuit of the plurality of pixel driving circuits includes transistors, and the transistors include a driving transistor, a data writing transistor and a first light-emitting control transistor. The array substrate further includes: first electrode regions and second electrode region of the transistors; a first electrode region of the driving transistor, a second electrode region of the data writing transistor and a second electrode region of the first light-emitting control transistor are connected through a conductive connection pattern, and the conductive connection pattern is a continuous pattern.

The plurality of pixel driving circuits are configured as: odd-numbered row circuit groups and even-numbered row circuit groups; the odd-numbered row circuit groups and the even-numbered row circuit groups each include pixel driving circuits arranged in a first direction; the odd-numbered row circuit groups and the even-numbered row circuit groups are alternately arranged in a second direction. The first direction and the second direction intersect. The array substrate further includes conductive patterns, and the conductive patterns include a pattern in the pixel driving circuit that is located in a different layer from the conductive connection pattern. A value of a capacitance created between a conductive connection pattern and a conductive pattern in at least one pixel driving circuit in an odd-numbered row circuit group is less than a value of a capacitance created between a conductive connection pattern and a conductive pattern in at least one pixel driving circuit in an even-numbered row circuit group.

In some embodiments, a material of an insulating layer between the conductive connection pattern and the conductive pattern in the at least one pixel driving circuit in the odd-numbered row circuit group is the same as a material of an insulating layer between the conductive connection pattern and the conductive pattern in the at least one pixel driving circuit in the even-numbered row circuit group.

In some embodiments, an insulating layer between the conductive connection pattern and the conductive pattern in the at least one pixel driving circuit in the odd-numbered row circuit group and an insulating layer between the conductive connection pattern and the conductive pattern in the at least one pixel driving circuit in the even-numbered row circuit group include at least one insulating layer of a same material.

In yet another aspect, a display device is provided, including the array substrate as described in any one of the above embodiments.

BRIEF DESCRIPTION OF THE DRAWINGS

In order to describe technical solutions in the present disclosure more clearly, the accompanying drawings to be used in some embodiments of the present disclosure will be introduced briefly. However, the accompanying drawings to be described below are merely drawings of some embodiments of the present disclosure, and a person of ordinary skill in the art can obtain other drawings according to those drawings. In addition, the accompanying drawings in the following description may be regarded as schematic diagrams, but are not limitations on actual sizes of products, actual processes of methods and actual timings of signals involved in the embodiments of the present disclosure.

DESCRIPTION OF THE INVENTION

Figure 1:
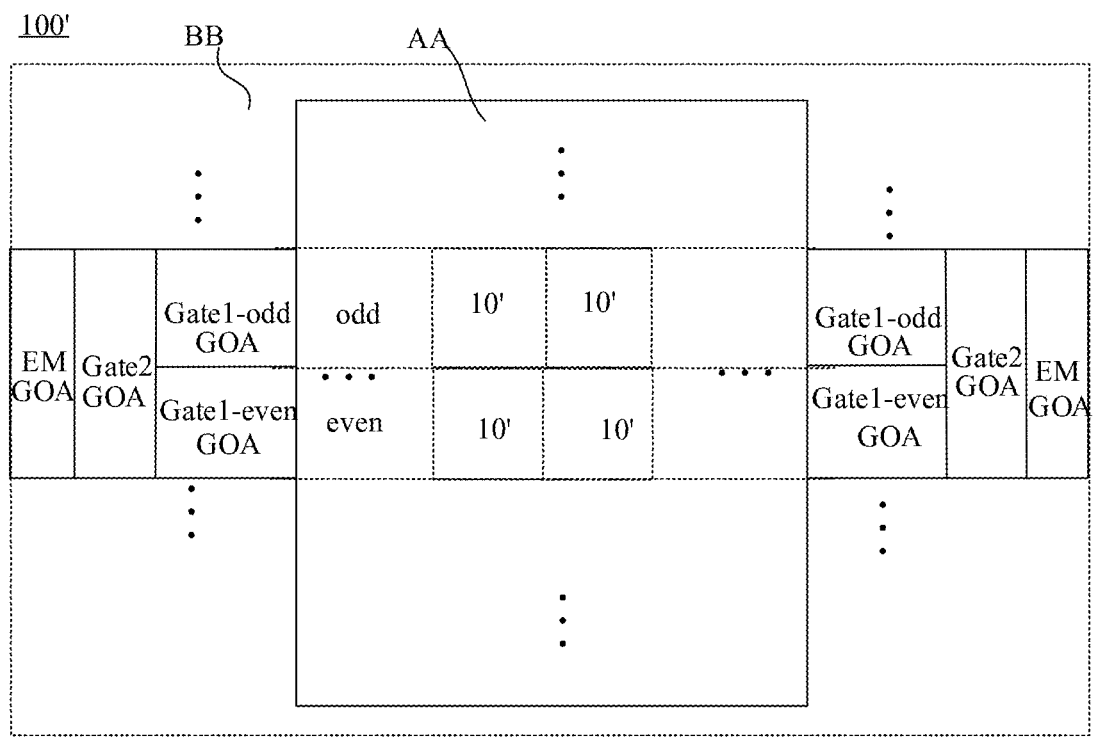
FIG. 1 is a structural diagram of a display panel, in accordance with some embodiments.

The technical solutions in some embodiments of the present disclosure will be described clearly and completely with reference to the accompanying drawings. However, the described embodiments are merely some but not all embodiments of the present disclosure. All other embodiments obtained by a person of ordinary skill in the art based on embodiments of the present disclosure shall be included in the protection scope of the present disclosure.

Unless the context requires otherwise, throughout the description and claims, the term "comprise" and other forms thereof such as the third-person singular form "comprises" and the present participle form "comprising" are construed as an open and inclusive meaning, i.e., "included, but not limited to". In the description of the specification, terms such as "one embodiment", "some embodiments", "exemplary embodiments", "example", "specific example" or "some examples" are intended to indicate that specific features, structures, materials or characteristics related to the embodiment(s) or example(s) are included in at least one embodiment or example of the present disclosure. Schematic representations of the above terms do not necessarily refer to the same embodiment(s) or example(s). In addition, the specific features, structures, materials, or characteristics described herein may be included in any one or more embodiments or examples in any suitable manner.

Hereinafter, the terms such as "first" and "second" are used for descriptive purposes only, and are not to be construed as indicating or implying a relative importance or implicitly indicating a number of indicated technical features. Thus, features defined with "first" and "second" may explicitly or implicitly include one or more of the features. In the description of the embodiments of the present disclosure, the term "multiple", "a plurality of" or "the plurality of" means two or more unless otherwise specified.

In the description of some embodiments, the terms "coupled" and "connected" and derivatives thereof may be used. The term "connected" should be understood in a broad sense. For example, the term "connected" may represent a fixed connection, or a detachable connection, or a one-piece connection; alternatively, the term "connected" may represent a direct connection, or an indirect connection through an intermediate medium. The term "coupled", for example, indicates that two or more components are in direct physical or electrical contact. The term "coupled" or "communicatively coupled" may also indicate that two or more components are not in direct contact with each other, but still cooperate or interact with each other. The embodiments disclosed herein are not necessarily limited to the context herein.

The phrase "at least one of A, B and C" has the same meaning as the phrase "at least one of A, B or C", both including following combinations of A, B and C: only A, only B, only C, a combination of A and B, a combination of A and C, a combination of B and C, and a combination of A, B and C.

The phrase "A and/or B" includes following three combinations: only A, only B, and a combination of A and B.

The term such as "about", "substantially" or "approximately" as used herein includes a stated value and an average value within an acceptable range of deviation of a particular value determined by a person of ordinary skill in the art, considering measurement in question and errors associated with measurement of a particular quantity (i.e., limitations of a measurement system).

The term such as "parallel", "perpendicular" or "equal" as used herein includes a stated case and a case similar to the stated case within an acceptable range of deviation determined by a person of ordinary skill in the art, considering measurement in question and errors associated with measurement of a particular quantity (i.e., limitations of a measurement system). For example, the term "parallel" includes absolute parallelism and approximate parallelism, and an acceptable range of deviation of the approximate parallelism may be, for example, a deviation within 5°; the term "perpendicular" includes absolute perpendicularity and approximate perpendicularity, and an acceptable range of deviation of the approximate perpendicularity may also be, for example, a deviation within 5°; and the term "equal" includes absolute equality and approximate equality, and an acceptable range of deviation of the approximate equality may be, for example, that a difference between two equals is less than or equal to 5% of either of the two equals.

It will be understood that, when a layer or element is referred to as being on another layer or substrate, it may be that the layer or element is directly on the another layer or substrate, or it may be that intervening layer(s) exist between the layer or element and the another layer or substrate.

Exemplary embodiments are described herein with reference to sectional views and/or plan views as idealized exemplary drawings. In the accompanying drawings, thicknesses of layers and sizes of regions are enlarged for clarity. Thus, variations in shape with respect to the accompanying drawings due to, for example, manufacturing technologies and/or tolerances may be envisaged. Therefore, the exemplary embodiments should not be construed as being limited to the shapes of the regions shown herein, but including shape deviations due to, for example, manufacturing. For example, an etched region shown in a rectangular shape generally has a feature of being curved. Therefore, the regions shown in the accompanying drawings are schematic in nature, and their shapes are not intended to show actual shapes of the regions in an apparatus, and are not intended to limit the scope of the exemplary embodiments.

With the development of organic light-emitting diode (OLED) display technology (e.g., active-matrix organic light-emitting diode (AMOLED) display technology), people have increasingly high requirements for the display effect of display products, and the design of pixel driver circuits in display products is crucial for the display characteristics of AMOLED products.

In an existing pixel driving circuit 10', the pixel driving circuit 10' includes: a light-emitting control signal line EM, a first scan signal line Gate1 and a second scan signal line Gate2. As shown in FIG. 1, gate on array (GOA) circuits for the first scan signal lines Gate1 drive rows one by one, and the GOA circuits for the first scan signal lines Gate1 include: GOA circuits (Gate1-odd GOA) for odd-numbered rows and GOA circuits (Gate1-even GOA) for even-numbered rows. However, in order to reduce the occupation of a bezel region BB of the display panel 100' by the GOA circuits to achieve a narrower bezel, GOA circuits for the light-emitting control signal lines EM and GOA circuits for the second scan signal lines Gate2 adopt a driving architecture of one GOA circuit driving two rows (i.e., one drive two). That is, a GOA circuit for one light-emitting control signal line EM and a GOA circuit for the second scan signal line Gate2 drive two rows of pixel driving circuits 10' located in a display region AA.

Figure 2:
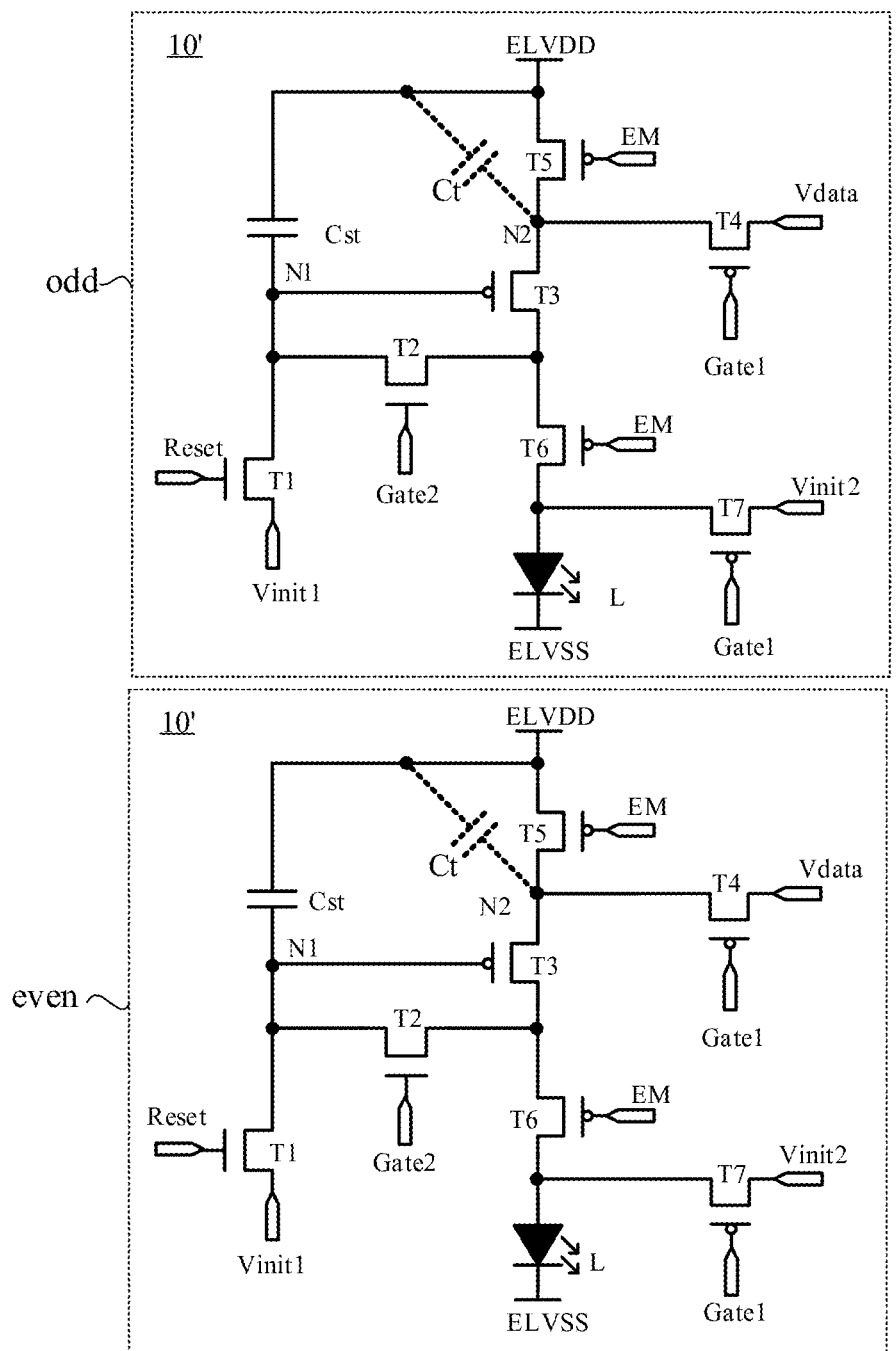
FIG. 2 is an equivalent circuit diagram of a pixel driving circuit, in accordance with some embodiments.

For example, as shown in FIG. 2, compensation transistors T2 in two adjacent rows of pixel driving circuits 10' are driven by the same second scan signal line Gate2. For example, a first reset transistor T1 and a compensation transistor T2 are low temperature polycrystalline oxide (LTPO) transistors, which are turned on at a high level, and the remaining transistors are P-type low temperature polysilicon (LTPS) transistors, which are turned on at a low level. As for the introduction of the transistors of the pixel driving circuit 10' and their connection relationship, reference may be made to the following description, and details will not be provided here.

Figure 3:
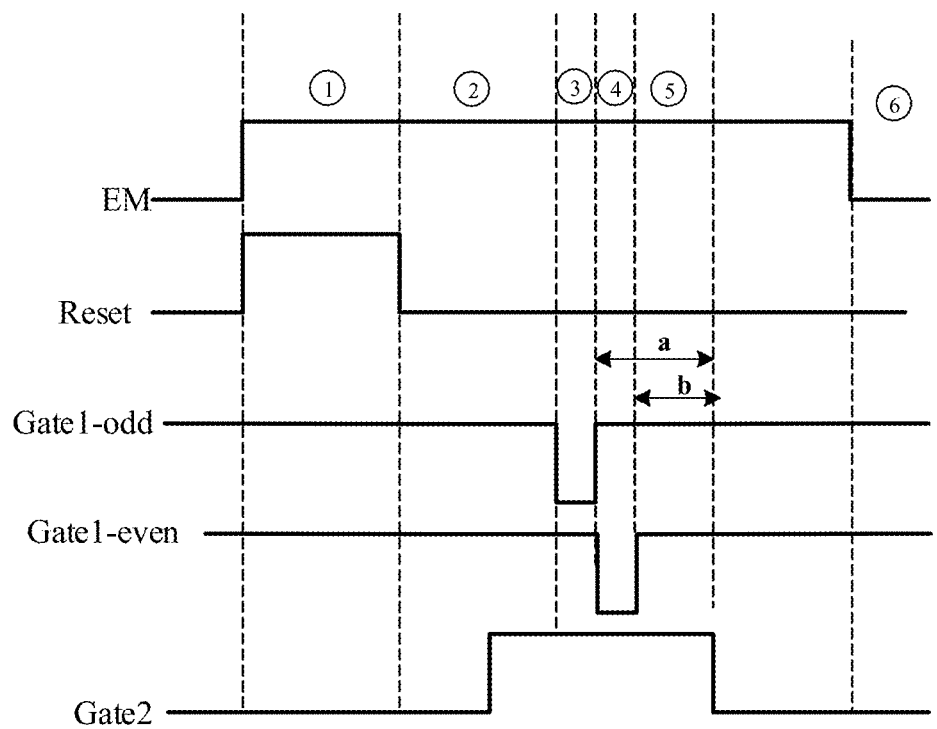
FIG. 3 is a timing diagram of the pixel driving circuit in FIG. 2, in accordance with some embodiments.

For example, as shown in FIG. 3, which shows a driving timing corresponding to the pixel driving circuit 10' shown in FIG. 2, there are 6 main phases: ① in which the light-emitting control signal line EM and the reset signal line Reset are both at high levels, and the first node N1 is reset by the signal the first initial signal line Vinit1; ② in which the second scan signal line Gate2 jumps to a high level, and compensation transistors T2 of pixel driving circuits 10' in the odd-numbered row odd and the even-numbered row even are turned on simultaneously; ③ in which the scan signal Gate1-odd of the first scan signal line Gate1 for the odd-numbered row odd is at a low level, and the data signal writing of the odd-numbered row odd and the threshold compensation of driving transistors T3 of the odd-numbered row odd are performed simultaneously; ④ in which the scan signal Gate1-even of the first scan signal line Gate1 for the even-numbered row even is at a low level, and the data signal writing of the even-numbered row even and the threshold compensation of driving transistors T3 of the even-numbered row even are performed simultaneously; ⑤ in which the data signal writing and the threshold compensation of driving transistors T3 of the odd-numbered row odd and the even-numbered row even are continuously performed using parasitic capacitances of second nodes N2 until the compensation transistors T2 in the odd-numbered row odd and the even-numbered row even are turned off simultaneously; and ⑥ in which the light-emitting control signal line EM is at a low level, and the odd-numbered row odd and the even-numbered row even emit light simultaneously.

The inventors found that in the above-mentioned pixel driving circuit 10', it can be seen from the driving timing diagram of FIG. 3 that, the duration for the odd-numbered row odd from the scan signal Gate1-odd being inactive to the signal of the second scan signal line Gate2 being inactive is a, and the duration for the even-numbered row even from the scan signal Gate1-even being inactive to the signal of the second scan signal line Gate2 being inactive is b, and the duration a is greater than the duration b.

After the signal of the first scan signal line Gate1 is inactive, no matter it is the odd-numbered row odd and the even-numbered row even, the pixel driving circuits 10' will continue to perform the data signal writing and threshold compensation on the first node N1 through the driving transistors T3 using the parasitic capacitances Ct at the second nodes N2. The parasitic capacitances Ct at the second nodes N2 in the pixel driving circuits 10' in the odd-numbered row odd and the even-numbered row even are exactly the same, but the duration a of the odd-numbered row odd and duration b of the even-numbered row even for continuously performing the data signal writing are different, and the duration a is greater than the duration b. Therefore, compensation results of the odd-numbered row odd and the even-numbered row even will be different under the same data signal voltage, which is eventually reflected in the display of the display panel 100' as the odd-numbered row odd is dark and the even-numbered row even is bright, resulting in a poor display and affecting the quality of pictures.

Figure 4:
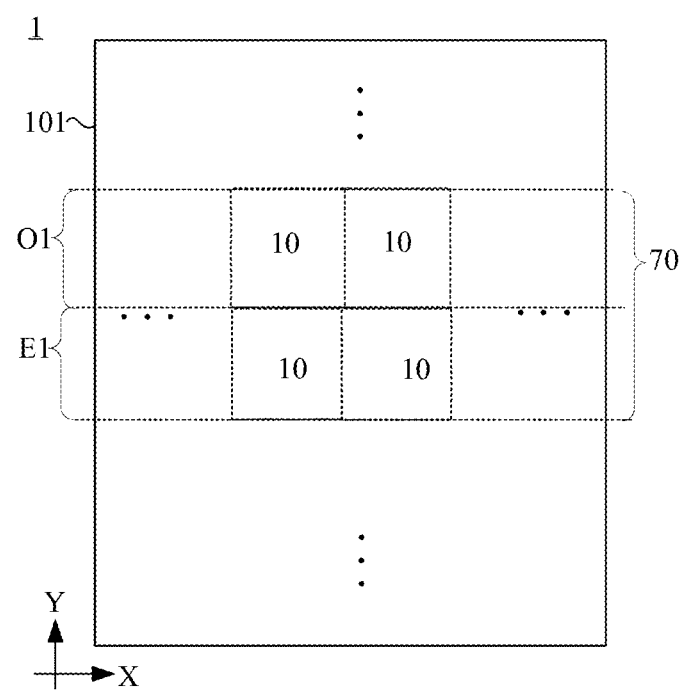
FIG. 4 is a structural diagram of an array substrate, in accordance with some embodiments of the present disclosure.
Figure 5:
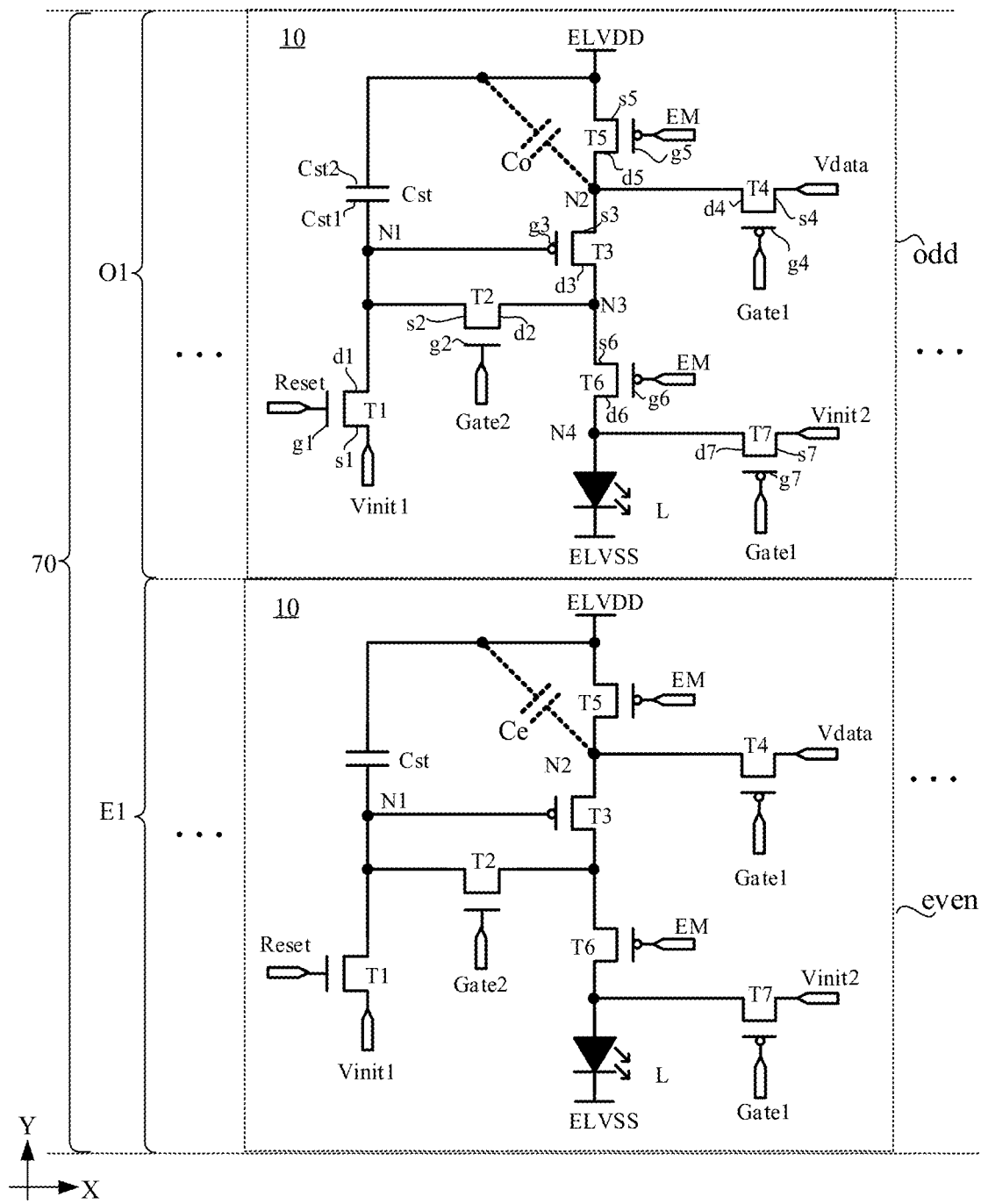
FIG. 5 is an equivalent circuit diagram of a pixel driving circuit, in accordance with some embodiments of the present disclosure.

In light of this, the present disclosure provides an array substrate 1. As shown in FIG. 4, the array substrate 1 includes a substrate 101 and a plurality of pixel driving circuits 10 disposed on the substrate 101. As shown in FIG. 5, each pixel driving circuit 10 of the plurality of pixel driving circuits 10 includes transistors, and the transistors include a driving transistor T3, a data writing transistor T4, and a first light-emitting control transistor T5.

Figure 6:
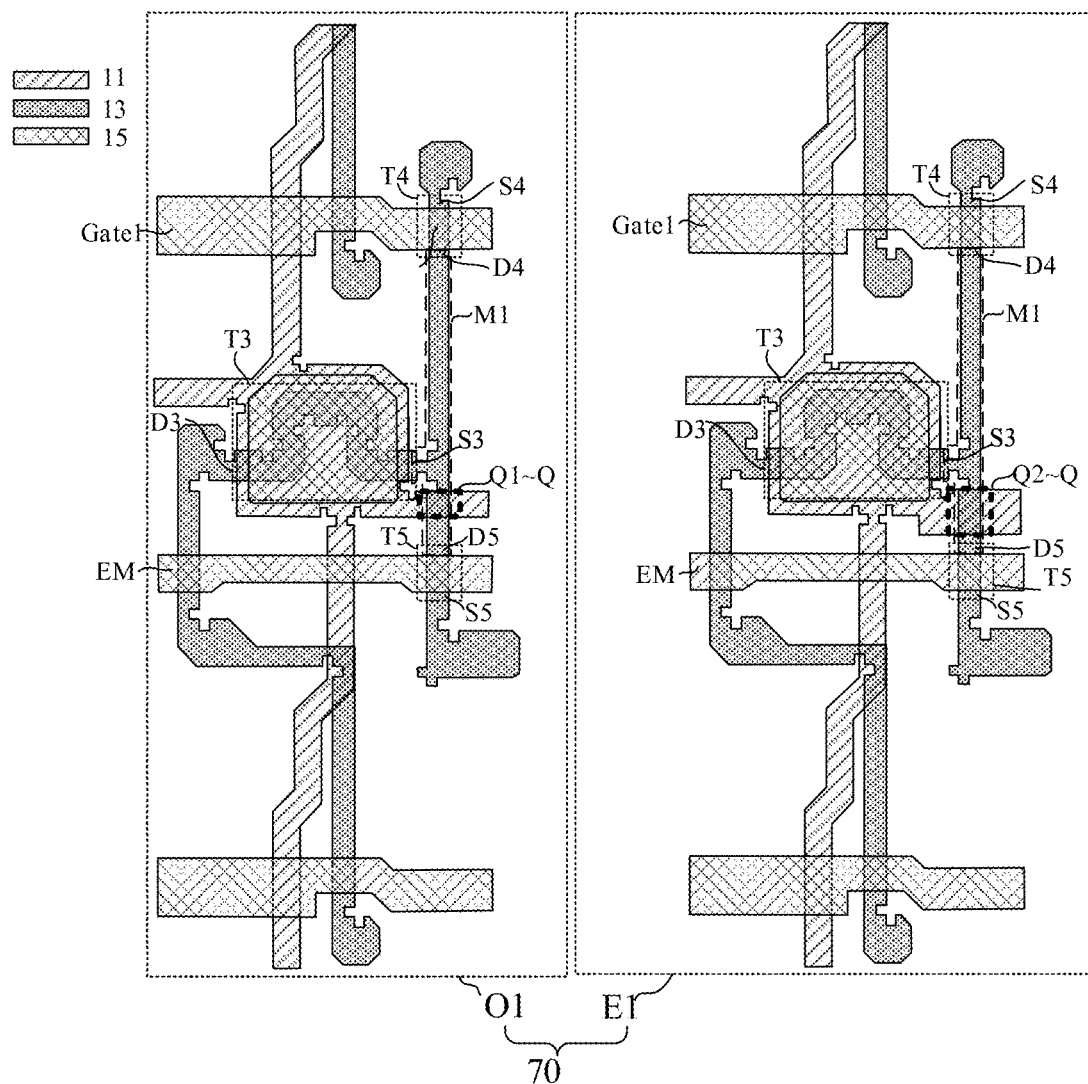
FIG. 6 is a diagram showing a structure of a shielding layer, a first semiconductor layer and a first gate conductive layer that are stacked, in accordance with some embodiments of the present disclosure.

As shown in FIG. 6, the array substrate 1 further includes: first electrode regions and second electrode regions of the transistors. A first electrode region S3 of the driving transistor T3, a second electrode region D4 of the data writing transistor T4 and a second electrode region D5 of the first light-emitting control transistor T5 are connected through a conductive connection pattern M1, and the conductive connection pattern M1 is a continuous pattern.

In the pixel driving circuit 10, as shown in FIG. 5, an electrical connection junction point of the driving transistor T3, the data writing transistor T4, and the first light-emitting control transistor T5 is a second node N2. Therefore, in the layout design of the array substrate 1, a region of the conductive connection pattern M1 corresponds to the second node N2 in the pixel driving circuit 10.

It will be understood that in the pixel driving circuit 10, the transistor includes a first electrode and a second electrode, the first electrode of the transistor in the pixel driving circuit 10 corresponds to the first electrode region of the transistor in the layout design of the array substrate 1, and the second electrode of the transistor in the pixel driving circuit 10 corresponds to the second electrode region of the transistor in the layout design of the array substrate 1. For example, the first electrode region S3 of the driving transistor T3 in FIG. 6 corresponds to the first electrode s3 of the driving transistor T3 in FIG. 5; the second electrode region D4 of the data writing transistor T4 in FIG. 6 corresponds to the second electrode d4 of the data writing transistor T4 in FIG. 5; and the second electrode region D5 of the first light-emitting control transistor T5 in FIG. 6 corresponds to the second electrode d5 of the first light-emitting control transistor T5 in FIG. 5.

Therefore, the conductive connection pattern M1 connecting the first electrode region S3 of the driving transistor T3, the second electrode region D4 of the data writing transistor T4 and the second electrode region D5 of the first light-emitting control transistor T5 in FIG. 6 corresponds to the electrical connection junction point (i.e. the second node N2) of the first electrode s3 of the driving transistor T3, the second electrode d4 of the data writing transistor T4 and the second electrode d5 of the first light-emitting control transistor T5. Then, it can be understood that the region of the conductive connection pattern M1 corresponds to the second node N2 in the pixel driving circuit 10, which indicates that the parasitic capacitance at the second node N2 is due to a parasitic capacitance created in the region of the conductive connection pattern M1 in the layout design of the array substrate 1.

The meaning of parasitic is that no capacitance is originally designed here, but there is always mutual capacitance between the wires, and the mutual capacitance may be considered to be parasitic between the wires, so it is called parasitic capacitance, also known as stray capacitance.

It will be noted that, in the circuits provided in the embodiments of the present disclosure, nodes do not represent actual components, but represent junction points of relevant electrical connections in a circuit diagram. That is, these nodes are equivalent to the junction points of the relevant electrical connections in the circuit diagram.

As shown in FIG. 4, the plurality of pixel driving circuits 10 are configured as odd-numbered row circuit groups O1 and even-numbered row circuit groups E1. The odd-numbered row circuit group O1 and the even-numbered row circuit group E1 each include a plurality of pixel driving circuits 10 arranged in a first direction X. The odd-numbered row circuit groups O1 and the even-numbered row circuit groups E1 are alternately arranged in a second direction Y. The first direction X and the second direction Y intersect.

For example, the first direction X is a row direction in which a plurality of pixel driving circuits 10 are arranged, and pixel driving circuits 10 in each row are referred to as a circuit group. The second direction Y is a column direction in which a plurality of pixel driving circuits 10 are arranged. A plurality of circuit groups are arranged in the second direction Y, which are a first row, a second row, a third row, ..., and an nth row; the first row, the third row, the fifth row ... are all odd-numbered rows and may be referred to as odd-numbered row circuit groups O1; the second row, the fourth row, the sixth row ... are all even-numbered rows and may be referred to as even-numbered row circuit groups E1. Therefore, the odd-numbered row circuit groups O1 and the even-numbered row circuit groups E1 are alternately arranged.

For example, the first direction X and the second direction Y are perpendicular to each other.

As shown in FIGS. 6, 11, and 13 to 17, the array substrate 1 further includes: conductive patterns Q, and the conductive patterns Q include a pattern in the pixel driving circuit 10 that is located in a different layer from the conductive connection pattern M1. An overlapping area of orthographic projections, on the substrate 101, of a conductive connection pattern M1 and a conductive pattern Q in at least one pixel driving circuit 10 in the odd-numbered row circuit group O1 is less than an overlapping area of orthographic projections, on the substrate 101, of a conductive connection pattern M1 and a conductive pattern Q in at least one pixel driving circuit 10 in the even-numbered row circuit group E1.

It will be noted that the "orthographic projection" herein refers to a projection created by projection lines that are perpendicular to a projection plane and parallel to each other.

It will be understood that, as shown in FIG. 4, the pixel driving circuits 10 are disposed on the substrate 101. The substrate 101 is not shown in FIGS. 5 to 17, and as for the position of the substrate 101, reference may be made to FIG. 4.

To facilitate understanding of the conductive pattern Q in the odd-numbered row circuit group O1 and the conductive pattern Q in the even-numbered row circuit group E1, as shown in FIGS. 6, 11, and 13 to 17, the conductive pattern Q in the odd-numbered row circuit group O1 is represented as a first conductive pattern Q1, and the conductive pattern Q in the even-numbered row circuit group E1 is represented as a second conductive pattern Q2.

When the orthographic projections, on the substrate 101, of the conductive pattern Q and the conductive connection pattern M1 overlap, a parasitic capacitance will be created between the conductive pattern Q and the conductive connection pattern M1. A magnitude of the parasitic capacitance is related to a magnitude of the overlapping area of the orthographic projections, on the substrate 101, of the conductive pattern Q and the conductive connection pattern M1. The greater the overlapping area of the orthographic projections, on the substrate 101, of the conductive pattern Q and the conductive connection pattern M1 is, the greater the created parasitic capacitance is.

For example, as shown in FIGS. 5 and 6, the overlapping area of the orthographic projection of the conductive connection pattern M1 in the odd-numbered row circuit group O1 on the substrate 101 and the orthographic projection of the first conductive pattern Q1 on the substrate 101 is less than the overlapping area of the orthographic projection of the conductive connection pattern M1 in the even-numbered row circuit group E1 on the substrate 101 and the orthographic projection of the second conductive pattern Q2 on the substrate 101. Therefore, the parasitic capacitance Ce created at the second node N2 in the even-numbered row circuit group E1 is greater than the parasitic capacitance Ce created at the second node N2 in the odd-numbered row circuit group O1.

As mentioned above, the duration a in which the odd-numbered row odd continues to perform the data signal writing and the duration b in which the even-numbered row even continues to perform the data signal writing are different, and the duration a is greater than the duration b. As for details, reference is made to the above description, which will not be repeated here. In the embodiments of the present disclosure, the parasitic capacitance Ce at the second node N2 in the odd-numbered row circuit group O1 and the parasitic capacitance Ce at the second node N2 in the even-numbered row circuit group E1 are designed differentially, the parasitic capacitance Ce at the second node N2 in the odd-numbered row circuit group O1 is designed to be smaller, and the parasitic capacitance Ce at the second node N2 in the even-numbered row circuit group E1 is designed to be larger.

Based on this design, under the existing one-drive-two driving architecture of the compensation transistor T2, after the signal of the first scan signal line Gate1 is inactive, the compensation duration a of the compensation transistor T2 in the odd-numbered row circuit group O1 is greater than the compensation duration b of the compensation transistor T2 in the even-numbered row circuit group E1. However, the parasitic capacitance Ce at the second node N2 in the even-numbered row circuit group E1 is greater than the parasitic capacitance Co at the second node N2 in the odd-numbered row circuit group O1.

Therefore, after the signal of the first scan signal line Gate1 is inactive, the potential of the second node N2 in the even-numbered row circuit group E1 drops slowly, and the potential of the second node N2 in the odd-numbered row circuit group O1 drops quickly. Although the compensation duration b for the even-numbered row circuit group E1 is less than the compensation duration a for the odd-numbered row circuit group O1, the potential of the second node N2 in the even-numbered row circuit group E1 drops slowly, more charge is written for the same duration, resulting in the consistent compensation effect of the odd-numbered row circuit group O1 and the even-numbered row circuit group E1.

Under the same data voltage, the light-emitting devices L driven by the pixel driving circuits 10 in the odd-numbered row circuit group O1 and the light-emitting devices L driven by the pixel driving circuits 10 in the even-numbered row circuit group E1 have no difference in light-emitting brightness, thereby solving the problem of difference in brightness of the odd-numbered row and the even-numbered row caused by inconsistent compensation durations of the compensation transistors T2 of the pixel driving circuits 10 in the odd-numbered and even-numbered rows, and improving the image quality of the display panel 100.

For example, the conductive pattern Q is a pattern in the pixel driving circuit 10 that is located in a different layer from the conductive connection pattern M1. The conductive pattern Q is not connected to the conductive connection pattern M1, and the conductive pattern Q and the conductive connection pattern M1 are located in different film layers.

It will be noted that, as shown in FIG. 6, in order to more clearly illustrate the structural design of parasitic capacitances created in the regions of the conductive connection patterns M1 in the odd-numbered row circuit group O1 and the even-numbered row circuit group E1, other film layers that do not affect the differential design of parasitic capacitance are not shown in the figure, the design of other film layers of the array substrate 1 will not be limited, and the same applies to the following. In addition, the layout design of the region of the conductive connection pattern M1 is mainly illustrated in the embodiments of the present disclosure, and the design of region(s) other than the region of the conductive connection pattern M1 will not be limited.

Figure 7:
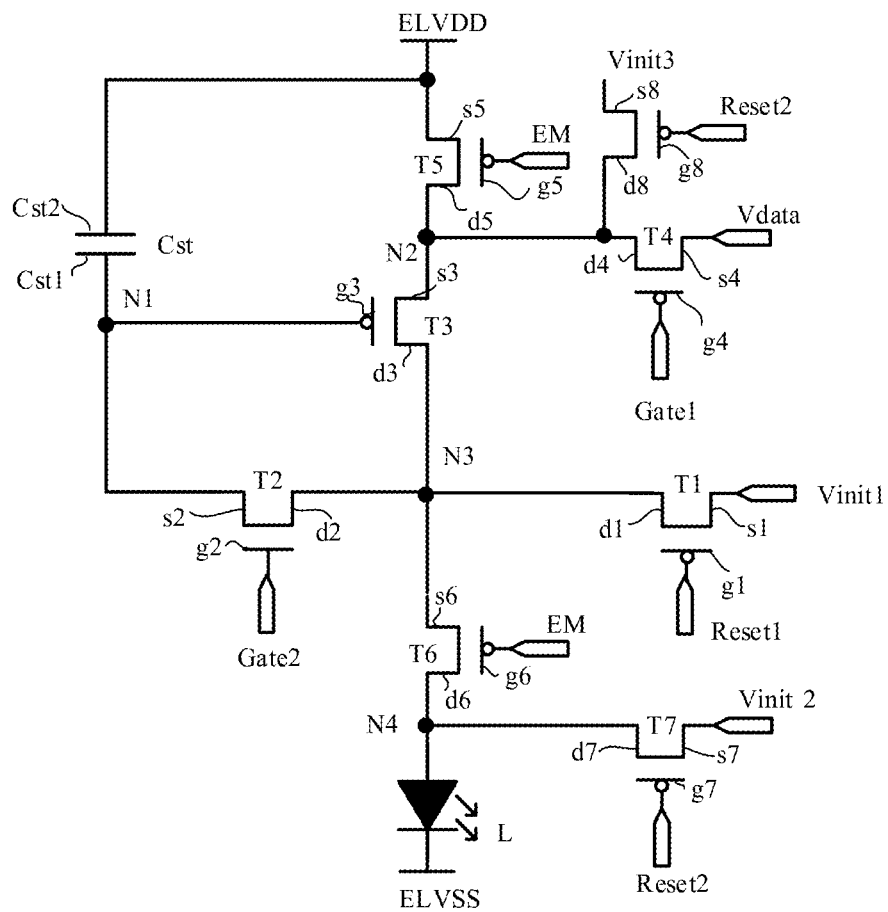
FIG. 7 is an equivalent circuit diagram of another pixel driving circuit, in accordance with some embodiments of the present disclosure.
Figure 9:
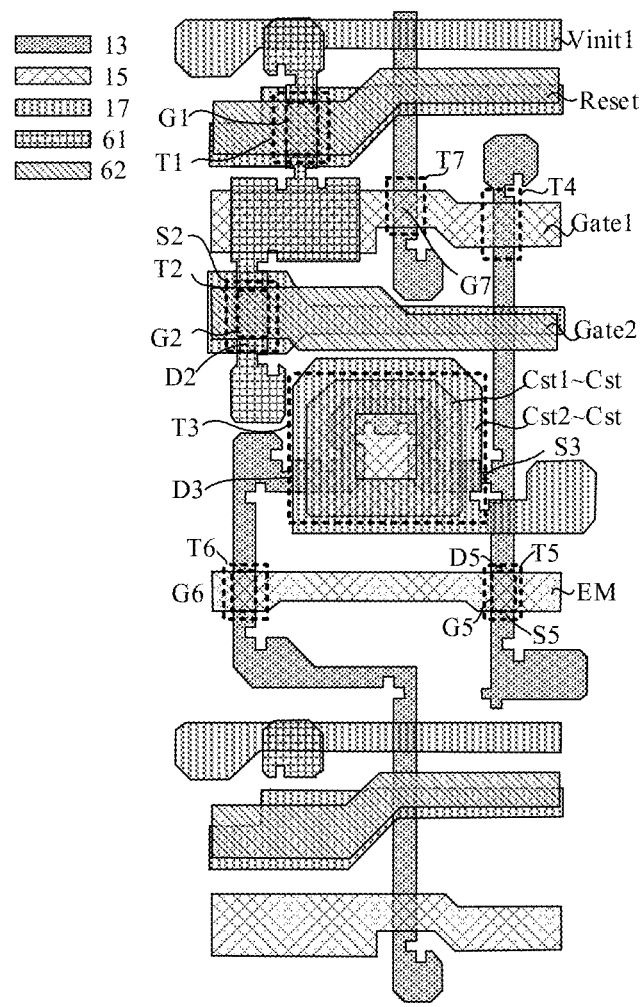
FIG. 9 is a diagram showing a structure of a first semiconductor layer, a first gate conductive layer, a second gate conductive layer, a second semiconductor layer and a third gate conductive layer that are stacked, in accordance with some embodiments of the present disclosure.

In some embodiments, as shown in FIGS. 5 and 7, the transistors further includes a compensation transistor T2. As shown in FIG. 9, the array substrate 1 further includes: a gate pattern G2 of the compensation transistor T2 and a second scan signal line Gate2, and the gate pattern G2 of the compensation transistor T2 is electrically connected to the second scan signal line Gate2. A second electrode region D2 of the compensation transistor T2 is connected to the second electrode region D3 of the driving transistor T3.

As shown in FIGS. 4 and 5, the plurality of pixel driving circuits 10 are also configured as: a plurality of pixel group units 70 arranged in sequence in the second direction Y; each pixel group unit 70 of the plurality of pixel group units 70 includes: an odd-numbered row circuit group O1 and an even-numbered row circuit group E1 arranged adjacent to the odd-numbered row circuit group O1; and each pixel group unit 70 shares one second scan signal line Gate2.

For example, the second direction Y is the column direction in which a plurality of pixel driving circuits 10 are arranged, and a plurality of circuit groups are arranged in the second direction Y, which are a first row, a second row, a third row, . . . , an nth row; the first row and the second row are one pixel group unit 70, the third row and the fourth row are another pixel group unit 70, the fifth row and the sixth row are yet another pixel group unit 70 . . . , and each pixel group unit 70 shares one second scan signal line Gate2.

Each pixel group unit 70 shares one second scan signal line Gate2, which is a one-drive-two driving architecture of the second scan signal line Gate2. Under the one-drive-two driving architecture of the second scan signal line Gate2, the design in the embodiments of the present disclosure (that is, the overlapping area of the orthographic projection of the conductive connection pattern M1 in the odd-numbered row circuit group O1 on the substrate 101 and the orthographic projection of the conductive pattern Q on the substrate 101 is less than the overlapping area of the orthographic projection of the conductive connection pattern M1 in the even-numbered row circuit group E1 on the substrate 101 and the orthographic projection of the conductive pattern Q on the substrate 101) may solve the problem of difference in brightness of the light-emitting devices L driven by the odd-numbered row circuit group O1 and the even-numbered row circuit group E1.

In order to facilitate understanding of the design of the conductive pattern Q, an exemplary structure of the pixel driving circuit 10 and an exemplary structure of the layout design of the array substrate 1 will be firstly introduced below. It will be understood that the following content is only an example of the structure of the pixel driving circuit 10 and the structure of the layout design of the array substrate 1, and is not a limitation on the structure of the pixel driving circuit 10 and the structure of the layout design of the array substrate 1.

In some embodiments, the pixel driving circuit may be a circuit including 7T1C, 8T1C or 9T1C, where T represents a thin film transistor, a number preceding T represents the number of thin film transistors, C represents a capacitor, and a number preceding C represents the number of capacitors.

In some embodiments, based on the structure of the pixel driving circuit 10 shown in FIG. 5, the pixel driving circuit 10 includes a first reset transistor T1, a compensation transistor T2, a driving transistor T3, a data writing transistor T4, a first light-emitting control transistor T5, a second light-emitting transistor T6, and a second reset transistor T7.

For example, as shown in FIG. 5, the first reset transistor T1 includes a gate g1, a first electrode s1 and a second electrode d1. The gate g1 of the first reset transistor T1 is electrically connected to a reset signal terminal, the first electrode s1 of the first reset transistor T1 is electrically connected to a first initial signal terminal, and the second electrode d1 of the first reset transistor T1 is electrically connected to a first node N1. The reset signal terminal is used to receive a reset signal transmitted by a reset signal line Reset. The first initial signal terminal is used to receive an initial signal transmitted by a first initial signal line Vinit1. The first reset transistor T1 is configured to transmit the initial signal received at the first initial signal line Vinit1 to the first node N1 in response to the reset signal received at the reset signal line Reset, so as to reset a gate g3 of the driving transistor T3.

It will be noted that, in the embodiments of the present disclosure, a first electrode of a transistor is one of a source and a drain of the transistor, and a second electrode of the transistor is the other of the source and the drain of the transistor. Since the source and the drain of the transistor may be symmetrical in structure, there may be no difference in structure between the source and the drain of the transistor. That is to say, the first electrode and the second electrode of the transistor in the embodiments of the present disclosure may be the same in structure. For example, in a case where the transistor is a P-type transistor, the first electrode of the transistor is the source, and the second electrode of the transistor is the drain. For example, in a case where the transistor is an N-type transistor, the first electrode of the transistor is the drain, and the second of the transistor is the source.

For example, as shown in FIG. 5, the compensation transistor T2 includes a gate g2, a first electrode s2 and a second electrode d2. The gate g2 of the compensation transistor T2 is electrically connected to a second scan signal terminal, the first electrode s2 of the compensation transistor T2 is electrically connected to the first node N1, and the second electrode d2 of the compensation transistor T2 is electrically connected to a third node N3. The second scan signal terminal is used to receive a scan signal transmitted by a second scan signal line Gate2. The compensation transistor T2 is configured to perform threshold compensation on the driving transistor T3 in response to the scan signal received at the second scan signal line Gate2.

For example, as shown in FIG. 5, the driving transistor T3 includes the gate g3, a first electrode s3 and a second electrode d3. The gate g3 of the driving transistor T3 is electrically connected to the first node N1, the first electrode s3 of the driving transistor T3 is electrically connected to a second node N2, and the second electrode d3 of the driving transistor T3 is electrically connected to the third node N3. The driving transistor T3 is configured to generate a driving current signal.

For example, as shown in FIG. 5, the data writing transistor T4 includes a gate g4, a first electrode s4 and a second electrode d4. The gate g4 of the data writing transistor T4 is electrically connected to a first scan signal terminal, the first electrode s4 of the data writing transistor T4 is electrically connected to a data signal terminal, and the second electrode d4 of the data writing transistor T4 is electrically connected to the second node N2. The data signal terminal is used to receive a data signal transmitted by a data signal line Vdata. The data writing transistor T4 is configured to transmit the data signal received at the data signal line Vdata to the driving transistor T3 in response to a scan signal received at a first scan signal line Gate1.

For example, as shown in FIG. 5, the first light-emitting control transistor T5 includes a gate g5, a first electrode s5 and a second electrode d5. The gate g5 of the first light-emitting control transistor T5 is electrically connected to a light-emitting control signal terminal, the first electrode s5 of the first light-emitting control transistor T5 is electrically connected to a power supply signal terminal, and the second electrode d5 of the first light-emitting control transistor T5 is electrically connected to the second node N2. The light-emitting control signal terminal is used to receive a light-emitting control signal transmitted by a light-emitting control signal line EM. The power supply signal terminal is used to receive a power supply signal transmitted by a power supply signal line ELVDD. The first light-emitting control transistor T5 is configured to transmit the power supply signal received at the power supply signal line ELVDD to the driving transistor T3 in response to the light-emitting control signal received at the light-emitting control signal line EM.

For example, as shown in FIG. 5, the second light-emitting control transistor T6 includes a gate g6, a first electrode s6 and a second electrode d6. The gate g6 of the second light-emitting control transistor T6 is electrically connected to the light-emitting control signal terminal, the first electrode s6 of the second light-emitting control transistor T6 is electrically connected to the third node N3, and the second electrode d6 of the second light-emitting control transistor T6 is electrically connected to a fourth node N4. The second light-emitting control transistor T6 is configured to transmit the driving current signal to the light-emitting device L in response to the light-emitting control signal received at the light-emitting control signal line EM, so as to drive the light-emitting device L to emit light.

For example, as shown in FIG. 5, the second reset transistor T7 includes a gate g7, a first electrode s7 and a second electrode d7. The gate g7 of the second reset transistor T7 is electrically connected to the first scan signal terminal, the first electrode s7 of the second reset transistor T7 is electrically connected to a second initial signal terminal, and the second electrode d7 of the second reset transistor T7 is electrically connected to the fourth node N4. The second reset transistor T7 is configured to transmit an initial signal received at a second initial signal line Vinit2 to the light-emitting device L in response to the scan signal received at the first scan signal line Gate1, so as to reset the light-emitting device L.

For example, an anode of the light-emitting device L is electrically connected to the fourth node N4, and a cathode of the light-emitting device L is electrically connected to a reference voltage line ELVSS.

For example, as shown in FIG. 5, the pixel driving circuit 10 further includes a capacitor Cst. The capacitor Cst includes a first plate Cst1 and a second plate Cst2. The first plate Cst1 of the capacitor Cst is electrically connected to the first node N1, and the second plate Cst2 of the capacitor Cst is electrically connected to the power supply signal terminal.

For example, the first reset transistor T1 and the compensation transistor T2 may be oxide thin film transistors, i.e., LTPO transistors, which are turned on at a high level. The driving transistor T3, the data writing transistor T4, the first light-emitting control transistor T5, the second light-emitting control transistor T6, and the second reset transistor T7 are all P-type transistors of LTPS thin film transistors, which are turned on at a low level.

As for the driving timing diagram of the above-mentioned pixel driving circuit 10 reference may be made to FIG. 3, and details will not be repeated here.

It will be noted that, the above examples of the first reset transistor T1, the compensation transistor T2, the driving transistor T3, the data writing transistor T4, the first light-emitting control transistor T5, the second light-emitting transistor T6, and the second reset transistor T7 are not limitations on types of the transistors.

In some embodiments, based on the structure of the pixel driving circuit 10 shown in FIG. 7, the pixel driving circuit 10 includes a first reset transistor T1, a compensation transistor T2, a driving transistor T3, a data writing transistor T4, a first light-emitting control transistor T5, a second light-emitting transistor T6, a second reset transistor T7, a third reset transistor T8, and a capacitor Cst.

The compensation transistor T2 may be an N-type transistor. The first reset transistor T1, the driving transistor T3, the data writing transistor T4, the first light-emitting control transistor T5, the second light-emitting transistor T6, the second reset transistor T7 and the third reset transistor T8 may be P-type transistors.

For example, as shown in FIG. 7, a first electrode s2 of the compensation transistor T2 is connected to a gate g3 of the driving transistor T3, a second electrode d2 of the compensation transistor T2 is connected to a second electrode d3 of the driving transistor T3, and a gate g2 of the compensation transistor T2 is connected to a second scan signal terminal. A first electrode s1 of the first reset transistor T1 is connected to a first initial signal terminal, a second electrode d1 of the first reset transistor T1 is connected to the second electrode d2 of the compensation transistor T2, and a gate g1 of the first reset transistor T1 is connected to a first reset signal terminal. A first electrode s4 of the data writing transistor T4 is connected to a data signal terminal, a second electrode d4 of the data writing transistor T4 is connected to the first electrode s3 of the driving transistor T3, and a gate g4 of the data writing transistor T4 is connected to a first scan signal terminal. A first electrode s5 of the first light-emitting control transistor T5 is connected to a power supply signal terminal, and a second electrode d5 of the first light-emitting control transistor T5 is connected to the first electrode s3 of the driving transistor T3, and a gate g5 of the first light-emitting control transistor T5 is connected to a light-emitting control signal terminal. A first electrode s6 of the second light-emitting control transistor T6 is connected to the second electrode d3 of the driving transistor T3, and a gate g6 of the second light-emitting control transistor T6 is connected to the light-emitting control signal terminal. A first electrode s7 of the second reset transistor T7 is connected to a second initial signal terminal, a second electrode d7 of the second reset transistor T7 is connected to a second electrode d6 of the second light-emitting control transistor T6, and a gate g7 of the second reset transistor T7 is connected to a second reset signal terminal. A first electrode s8 of the third reset transistor T8 is connected to a third initial signal terminal, a second electrode d8 of the third reset transistor T8 is connected to the first electrode s3 of the driving transistor T3, and a gate g8 of the third reset transistor T8 is connected to the second reset signal terminal. A first plate Cst1 of the capacitor Cst is connected to the gate g3 of the driving transistor T3, and a second plate Cst2 of the capacitor Cst is connected to the power supply signal terminal. The pixel driving circuit 10 may be used to drive the light-emitting device L to emit light.

The second scan signal terminal is used to receive the second scan signal transmitted by the second scan signal line Gate2. The first initial signal terminal is used to receive the first initial signal transmitted by the first initial signal line Vinit1. The first reset signal terminal is used to receive the first reset signal transmitted by the first reset signal line Reset1. The data signal terminal is used to receive the data signal transmitted by the data signal line Vdata. The first scan signal terminal is used to receive the first scan signal transmitted by the first scan signal line Gate1. The power supply signal terminal is used to receive the power supply signal transmitted by the power supply signal line ELVDD. The light-emitting control signal terminal is used to receive the light-emitting control signal transmitted by the light-emitting control signal line EM. The second initial signal terminal is used to receive the second initial signal transmitted by the second initial signal line Vinit2. The second reset signal terminal is used to receive the second reset signal transmitted by the second reset signal line Reset2. The third initial signal terminal is used to receive a third initial signal transmitted by a third initial signal line Vinit3.

Figure 8:
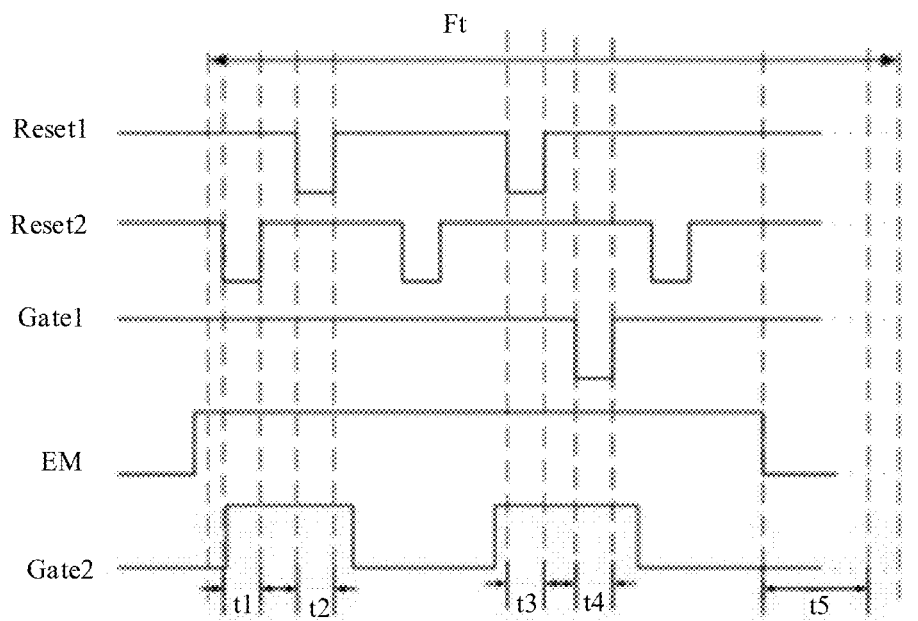
FIG. 8 is a timing diagram of the pixel driving circuit in FIG. 7, in accordance with some embodiments of the present disclosure.

For example, a timing diagram of the pixel driving circuit 10 shown in FIG. 7 is shown in FIG. 8, where EM represents a timing of the light-emitting control signal transmitted by the light-emitting control signal line EM, Gate1 represents a timing of the first scan signal transmitted by the first scan signal line Gate1, Gate2 represents a timing of the second scan signal transmitted by the second scan signal line Gate2, Reset1 represents a timing of the first reset signal transmitted by the first reset signal line Reset1, and Reset2 represents a timing of the second reset signal transmitted by the second reset signal line Reset2.

A method of driving the pixel driving circuit 10 in the embodiments of the present disclosure may include a scan frame Ft. The scan frame Ft may include a first reset phase t1, a second reset phase t2, a third reset phase t3, a data writing phase t4, and a light-emitting phase t5. In the first reset phase t1, the second scan signal terminal outputs a high-level signal, the second reset signal line Reset2 outputs a low-level signal, the compensation transistor T2, the second reset transistor T7 and the third reset transistor T8 are turned on, the second initial signal terminal inputs the second initial signal to the first electrode of the light-emitting device L, and the third initial signal terminal inputs the third initial signal to the first electrode s3 of the driving transistor T3. At the same time, the driving transistor T3 may be turned on, and the third initial signal terminal writes a reset signal into the gate g3 of the driving transistor T3. In the second reset phase t2, the second scan signal terminal outputs a high-level signal, the first reset signal terminal outputs a low-level signal, the first reset transistor T1 and the compensation transistor T2 are turned on, and the first initial signal terminal inputs the first initial signal to the gate g3 of the driving transistor T3. signal. In the third reset phase t3, the second scan signal terminal outputs a high-level signal, the first reset signal terminal outputs a low-level signal, the first reset transistor T1 and the compensation transistor T2 are turned on, and the first initial signal terminal inputs the first initial signal to the gate g3 of the driving transistor T3. In the data writing phase t4, the first scan signal terminal outputs a low-level signal, the second scan signal terminal outputs a high-level signal, the compensation transistor T2 and the data writing transistor T4 are turned on, and the data signal terminal outputs the data signal, so that a compensation voltage is written into the gate g3 of the driving transistor T3. In the light-emitting phase t5, the light-emitting control signal terminal outputs a low-level signal, the first light-emitting control transistor T5 and the second light-emitting control transistor T6 are turned on, and the driving transistor T3 drives the light-emitting device L to emit light due to the voltage of the gate g3 of the driving transistor T3.

In this exemplary embodiment, the gate g3 of the driving transistor T3 is connected to the first initial signal terminal through the compensation transistor T2 and the first reset transistor T1, so that the leakage current of the driving transistor T3 to the first initial signal terminal in the light-emitting phase may be reduced. In addition, in the first reset phase t1, the third initial signal terminal inputs a reset signal to the gate g3 of the driving transistor T3, and inputs the third initial signal to the first electrode s3 of the driving transistor T3. In this way, it may be possible to restore the hysteresis of the driving transistor T3 caused by a bias voltage in a previous frame and solve the problem of low brightness in a first frame.

It will be noted that, in other exemplary embodiments, the pixel driving circuit 10 may be driven by other methods, and the method of driving the pixel driving circuit 10 is not limited in the present disclosure.

The following is an exemplary introduction to a film layer structure design of an array substrate 1. It will be noted that the following examples are not limitations on the film layer structure design of the array substrate 1.

Figure 10:
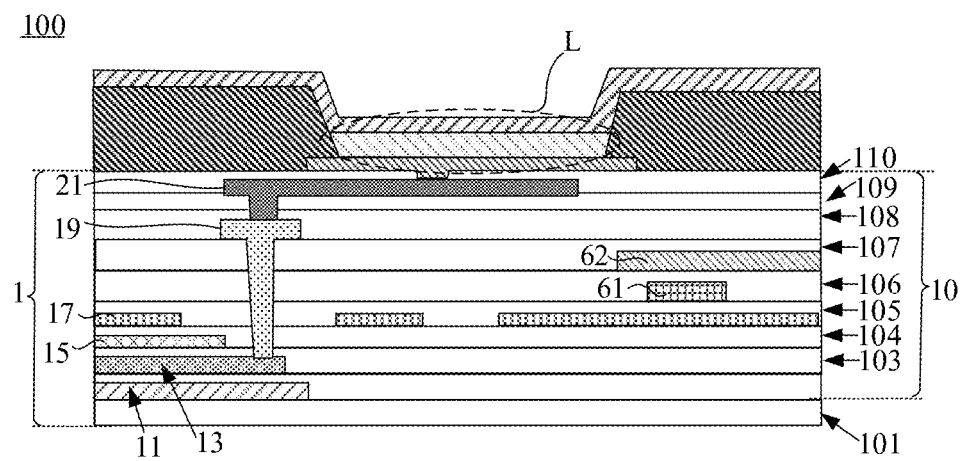
FIG. 10 is a structural diagram of a display panel, in accordance with some embodiments of the present disclosure.

As shown in FIG. 10, the display panel 100 includes: an array substrate 1 and light-emitting devices L. Pixel driving circuits 10 in the array substrate 1 are used to drive the light-emitting devices L to emit light. The array substrate 1 includes: a first semiconductor layer 13, a first gate conductive layer 15, a second gate conductive layer 17, a second semiconductor layer 61, a third gate conductive layer 62, a first source-drain metal layer 19 and a second source-drain metal layer 21 that are sequentially stacked on a substrate 101.

It should be noted that an insulating layer is provided between functional film layers in the array substrate 1. The functional film layers include the first semiconductor layer 13, the first gate conductive layer 15, the second gate conductive layer 17, the second semiconductor layer 61, the third gate conductive layer 62, the first source-drain metal layer 19 and the second source-drain metal layer 21. In the exemplary diagram of the layout design, in order to more clearly show the stacking relationship between the functional film layers, the insulating layer between the functional film layers is not shown.

For example, as shown in FIG. 10, the insulating layers include: a first gate insulating layer 103, a second gate insulating layer 104, a first inorganic insulating layer 105, a third gate insulating layer 106, a second inorganic insulating layer 107, a passivation layer 108, a first planarization layer 109 and a second planarization layer 110.

For example, the pixel driving circuit 10 includes a first semiconductor layer 13, a first gate insulating layer 103, a first gate conductive layer 15, a second gate insulating layer 104, a second gate conductive layer 17, a first inorganic insulating layer 105, a second semiconductor layer 61, a third gate insulating layer 106, a third gate conductive layer 62, a second inorganic insulating layer 107, a first source-drain metal layer 19, a passivation layer 108, a first planarization layer 109, a second source-drain metal layer 21, and a second planarization layer 110 that are sequentially stacked.

For example, a material of the first planarization layer 109 and a material of the second planarization layer 110 each include polyimide, and a material of the first inorganic insulating layer 105 and a material of the second inorganic insulating layer 107 each include any one of silicon nitride and silicon oxide.

The conductive connection pattern M1 and the conductive pattern Q in the embodiments of the present disclosure will be introduced below. The following embodiments may be understood based on the introduction to the film layer design of the pixel driving circuit 10 and the array substrate 1 in the above examples.

In some embodiments, as shown in FIGS. 6, 11, and 13 to 17, the array substrate 1 further includes: a first semiconductor layer 13 disposed on the substrate 101, and the conductive connection pattern M1 is located in the first semiconductor layer 13.

For example, a material of the first semiconductor layer 13 includes polysilicon (P-Si).

For example, the conductive connection pattern M1 is located in the first semiconductor layer 13, and the parasitic capacitance at the second node N2 includes: a parasitic capacitance between the conductive connection pattern M1 located in the first semiconductor layer 13 and the first gate conductive layer 15, a parasitic capacitance between the conductive connection pattern M1 and the second gate conductive layer 17, or a parasitic capacitance between the conductive connection pattern M1 and the first source-drain metal layer 19.

In some embodiments, as shown in FIG. 6, the array substrate 1 further includes: a shielding layer 11 disposed on the substrate 101, and a first semiconductor layer 13 disposed on a side of the shielding layer 11 away from the substrate 101; and the conductive pattern Q is located in the shielding layer 11.

For example, as shown in FIG. 6, an overlapping area of the orthographic projection, on the substrate 101, of the conductive connection pattern M1 in the odd-numbered row circuit group O1 and an orthographic projection, on the substrate 101, of the shielding layer 11 is less than an overlapping area of the orthographic projection, on the substrate 101, of the conductive connection pattern M1 in the even-numbered row circuit group E1 and the orthographic projection, on the substrate 101, of the shielding layer 11.

That is, as shown in FIG. 6, in the layout design of the first semiconductor layer 13, the conductive connection pattern M1 in the odd-numbered row circuit group O1 and the conductive connection pattern M1 in the even-numbered row circuit group E1 may have the same shape and the same area. In the layout design of the shielding layer 11, an area of the second conductive pattern Q2 is greater than an area of the first conductive pattern Q1, so that the overlapping area of the orthographic projection of the first conductive pattern Q1 on the substrate 101 and the orthographic projection of the conductive connection pattern M1 on the substrate 101 is less than the overlapping area of the orthographic projection of the second conductive pattern Q2 on the substrate 101 and the orthographic projection of the conductive connection pattern M1 on the substrate 101. Thus, in a pixel group unit 70, the parasitic capacitance at the second node N2 of the pixel driving circuit 10 in the even-numbered row circuit group E1 is greater than the parasitic capacitance at the second node N2 of the pixel driving circuit 10 in the odd-numbered row circuit group O1.

It will be understood that, in a pixel group unit 70, the overlapping area of the orthographic projection of the first conductive pattern Q1 on the substrate 101 and the orthographic projection of the conductive connection pattern M1 on the substrate 101 is less than the overlapping area of the orthographic projection of the second conductive pattern Q2 on the substrate 101 and the orthographic projection of the conductive connection pattern M1 on the substrate 101.

Alternatively, in the entire layout design of the array substrate 1, the overlapping area of the orthographic projection of every first conductive pattern Q1 on the substrate 101 and the orthographic projection of the conductive connection pattern M1 on the substrate 101 is less than the overlapping area of the orthographic projection of every second conductive pattern Q2 on the substrate 101 and the orthographic projection of the conductive connection pattern M1 on the substrate 101.

That is, in a pixel group unit 70, the parasitic capacitance Ce at the second node N2 of the pixel driving circuit 10 in the even-numbered row circuit group E1 is greater than the parasitic capacitance Co at the second node N2 of the pixel driving circuit 10 in the odd-numbered row circuit group O1, which is not limited here.

For example, the shielding layer 11 may be connected to a fixed potential to shield the influence of surrounding stray charges on the driving transistor T3.

Figure 11:
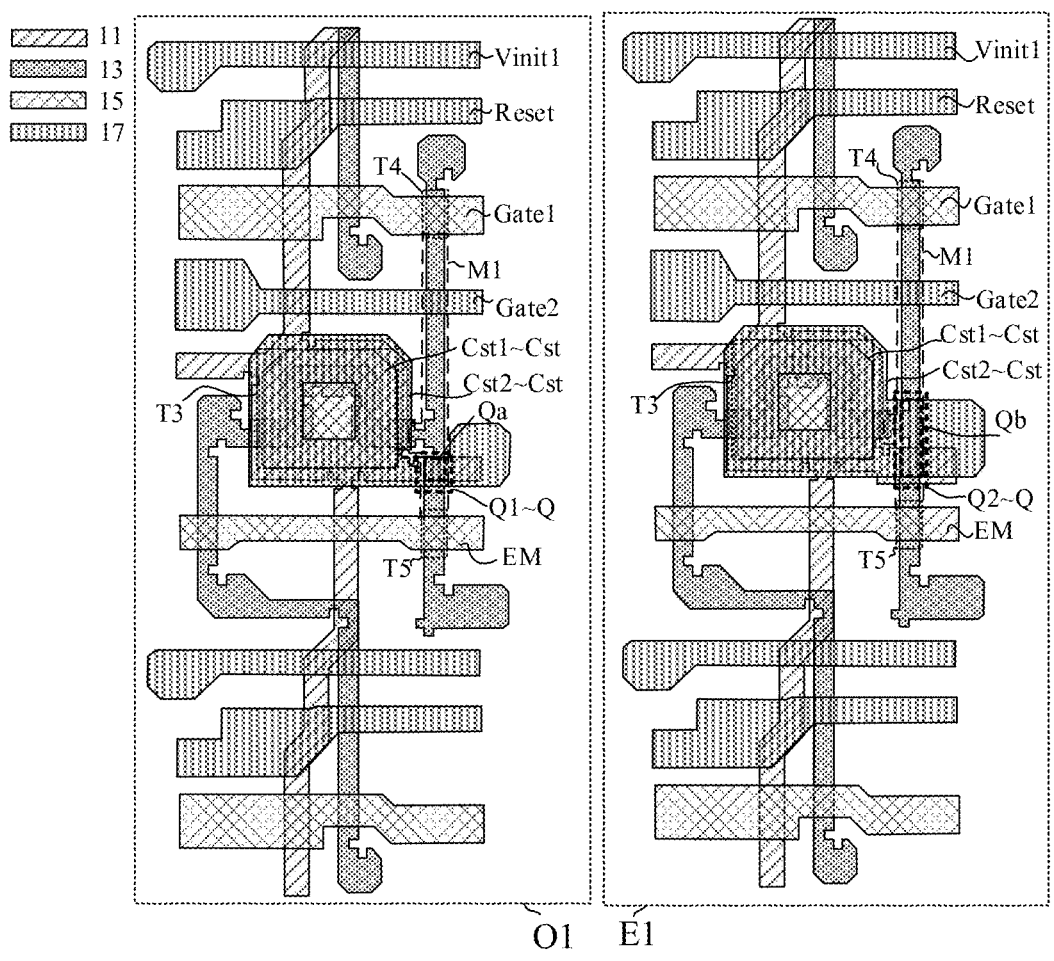
FIG. 11 is a diagram showing a structure of a shielding layer, a first semiconductor layer, a first gate conductive layer and a second gate conductive layer that are stacked, in accordance with some embodiments of the present disclosure.

In some embodiments, as shown in FIG. 11, the array substrate 1 further includes: a first gate conductive layer 15 disposed on a side of the first semiconductor layer 13 away from the substrate 101, and a second gate conductive layer 17 disposed on a side of the first gate conductive layer 15 away from the substrate 101.

As shown in FIGS. 5 and 9, the pixel driving circuit 10 further includes: a capacitor Cst and a compensation transistor T2. The capacitor Cst includes: a first plate Cst1 and a second plate Cst2. The first plate Cst1 is located in the first gate conductive layer 15, and the second plate Cst2 is located in the second gate conductive layer 17. The first plate Cst1 is electrically connected to a first electrode region S2 of the compensation transistor T2, and the second plate Cst2 is electrically connected to a power supply signal line ELVDD.

It will be noted that the first plate Cst1 is connected to the first electrode region S2 of the compensation transistor T2 through a via hole, the second plate Cst2 is connected to the power supply signal line ELVDD through a via hole, and a first electrode region S5 of a first light-emitting control transistor T5 is connected to the power supply signal line ELVDD through a via hole. In order to more clearly indicate the position of each transistor, a connection pattern between the first plate Cst1 and the first electrode region S2 of the compensation transistor T2 and a connection pattern between the second plate Cst2 and the power supply signal line ELVDD are not shown.

Figure 12:
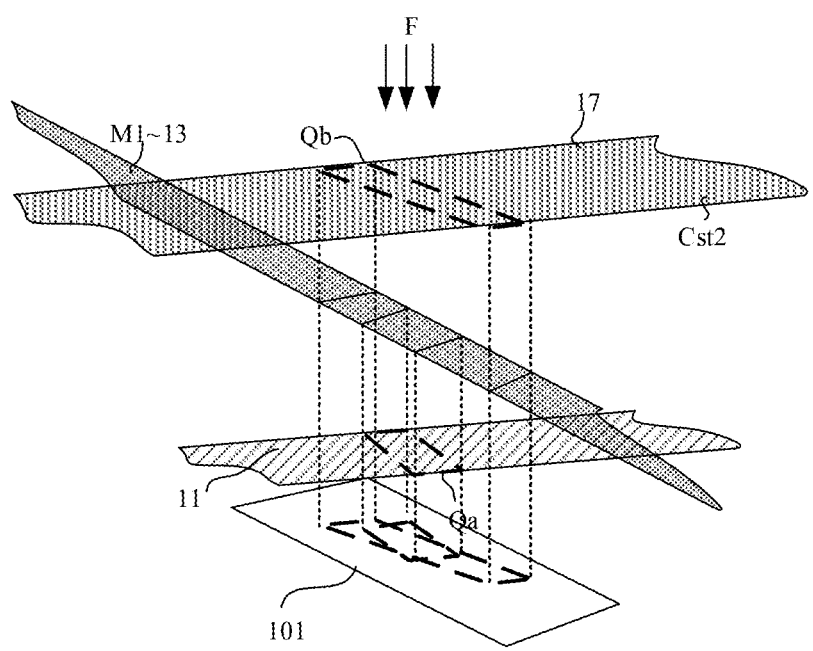
FIG. 12 is a diagram showing a partial structure of a shielding layer, a first semiconductor layer and a second gate conductive layer that are stacked, in accordance with some embodiments of the present disclosure.

As shown in FIGS. 11 and 12, the conductive pattern Q includes a first portion Qa located in the shielding layer 11 and a second portion Qb electrically connected to the second plate Cst2.

For example, as shown in FIG. 12, the shielding layer 11, the first semiconductor layer 13 and the second gate conductive layer 17 are sequentially arranged on a side of the substrate 101, F represents an incident direction of the projection lines, and the incident direction of the projection lines may be perpendicular to a plane where the substrate 101 is located. It is observed from the incident direction of the projection lines that, an overlapping area of the second plate Cst2 and the conductive connection pattern M1 is equal to the overlapping area of the orthographic projection of the second plate Cst2 on the substrate 101 and the orthographic projection of the conductive connection pattern M1 on the substrate 101.

It can be seen from FIG. 12 that, the overlapping area of the orthographic projections of the conductive pattern Q and the conductive connection pattern M1 on the substrate 101 includes two parts: an overlapping area of the second portion Qb and the conductive connection pattern M1 in the direction of the projection lines, and an overlapping area of the first portion Qa in the shielding layer 11 and the conductive connection pattern M1 in the direction of the projection lines. Therefore, in this embodiment, the conductive connection pattern M1 is located between the second electrode Cst2 and the shielding layer 11, and a sandwich parasitic capacitance is created at the conductive connection pattern M1. A size of the sandwich parasitic capacitance is directly proportional to a sum of the overlapping area of the second portion Qb and the conductive connection pattern M1 in the direction of the projection lines, and the overlapping area of the first portion Qa in the shielding layer 11 and the conductive connection pattern M1 in the direction of the projection lines.

For example, as shown in FIG. 12, a sum of the overlapping area of the second portion Qb in the odd-numbered row circuit group O1 and the conductive connection pattern M1 in the direction of the projection lines and the overlapping area of the first portion Qa in the shielding layer 11 and the conductive connection pattern M1 in the direction of the projection lines, is less than a sum of the overlapping area of the second portion Qb in the even-numbered row circuit group E1 and the conductive connection pattern M1 in the direction of the projection lines and the overlapping area of the first portion Qa in the shielding layer 11 and the conductive connection pattern M1 in the direction of the projection lines. Therefore, it may realize the purpose of a larger parasitic capacitance Ce at the second node N2 in the even-numbered row circuit group E1, and may solve the problem of difference in brightness of the light-emitting devices L driven by the odd-numbered row circuit group O1 and the even-numbered row circuit group E1.

Figure 13:
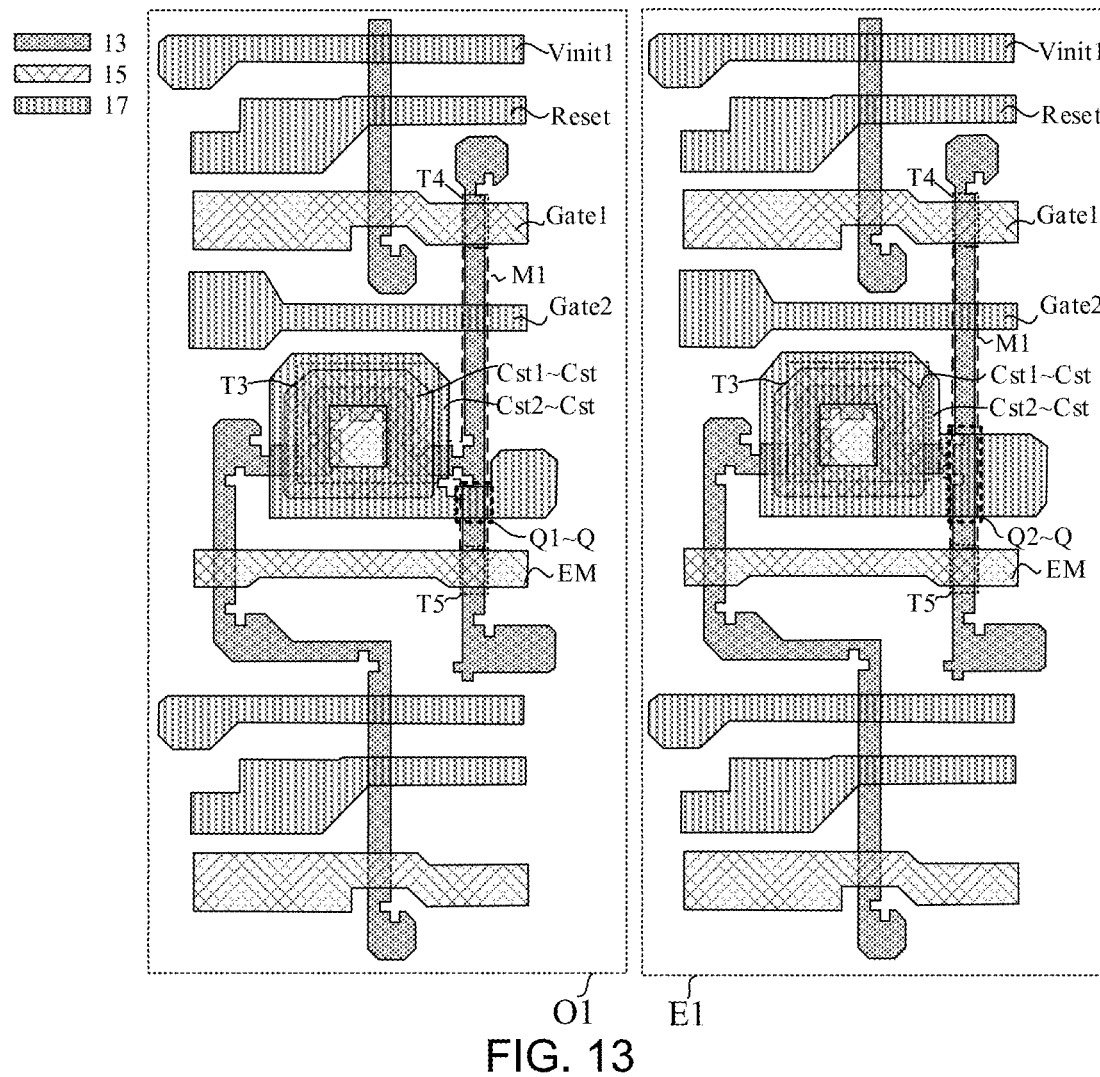
FIG. 13 is diagram showing a structure of a first semiconductor layer, a first gate conductive layer and a second gate conductive layer that are stacked, in accordance with some embodiments of the present disclosure.

In some embodiments, as shown in FIG. 13, the array substrate 1 further includes: a first gate conductive layer 15 disposed on a side of the first semiconductor layer 13 away from the substrate 101, and a second gate conductive layer 17 disposed on a side of the first gate conductive layer 15 away from the substrate 101. The conductive pattern Q is located in the second gate conductive layer 17.

For example, as shown in FIG. 13, the pixel driving circuit 10 further includes a capacitor Cst, the capacitor Cst includes a first plate Cst1 and a second plate Cst2, the first plate Cst1 is located in the first gate conductive layer 15, and the second plate Cst2 is located in the second gate conductive layer 17. The conductive pattern Q located in the second gate conductive layer 17 is electrically connected to the second plate Cst2, which may also be understood as the conductive pattern Q being located in the second plate Cst2.

For example, as shown in FIG. 13, the second plate Cst2 in the odd-numbered row circuit group O1 is provided with a first conductive pattern Q1, and the second plate Cst2 in the even-numbered row circuit group E1 is provided with a second conductive pattern Q2. The overlapping area of the orthographic projection of the first conductive pattern Q1 in the odd-numbered row circuit group O1 on the substrate 101 and the orthographic projection of the conductive connection pattern M1 on the substrate 101 is less than the overlapping area of the orthographic projection of the second conductive pattern Q2 in the even-numbered row circuit group E1 on the substrate 101 and the orthographic projection of the conductive connection pattern M1 on the substrate 101. Therefore, the parasitic capacitance Ce created by the even-numbered row circuit group E1 at the second node N2 is greater than the parasitic capacitance Co generated by the odd-numbered row circuit group O1 at the second node N2, which may solve the problem of difference in brightness of the light-emitting devices L driven by the odd-numbered row circuit group O1 and the even-numbered row circuit group E1.

Figure 14:
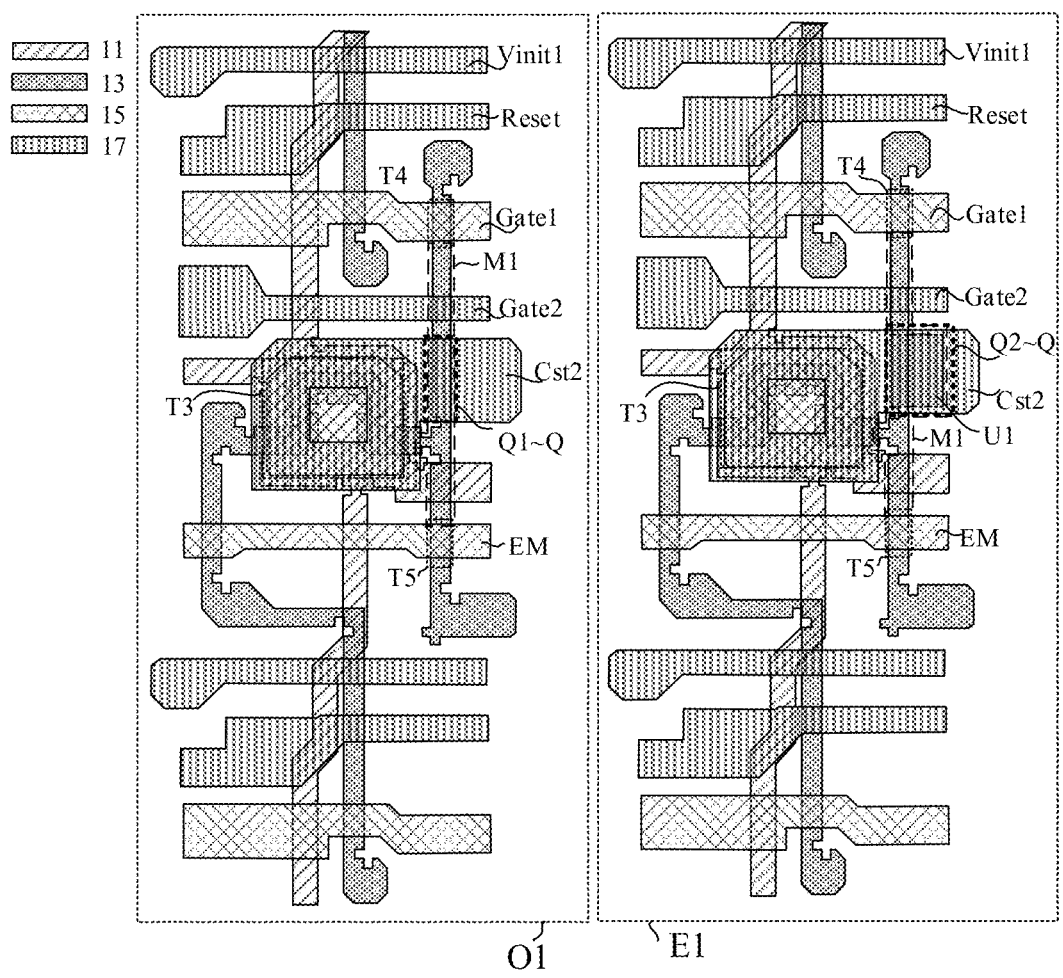
FIG. 14 is a diagram showing a structure of a shielding layer, a first semiconductor layer, a first gate conductive layer and a second gate conductive layer that are stacked, in accordance with some other embodiments of the present disclosure.

In some embodiments, as shown in FIG. 14, an area of the orthographic projection, on the substrate 101, of the conductive pattern Q in the odd-numbered row circuit group O1 is equal to an area of the orthographic projection, on the substrate, of the conductive pattern Q in the even-numbered row circuit group E1.

For example, the conductive pattern Q is located in the second plate Cst2, and design areas of the second plates Cst2 in the odd-numbered row circuit group O1 and the even-numbered row circuit group E1 are the same. That is to say, in the layout design, the second plates Cst2 in the odd-numbered row circuit group O1 and the even-numbered row circuit group E1 may have the same shape and the same area.

As shown in FIG. 14, in the even-numbered row circuit group E1, the conductive connection pattern M1 is connected to a first extension pattern U1 located in the first semiconductor layer 13, and the orthographic projection of the conductive pattern Q on the substrate 101 covers an orthographic projection of the first extension pattern U1 on the substrate 101.

For example, as shown in FIG. 14, in the even-numbered row circuit group E1, the first extension pattern U1 and the conductive connection pattern M1 are connected and both are located in the first semiconductor layer 13. The first extension pattern U1 and the conductive connection pattern M1 may be formed into a one-piece structure. That is, a design area of the conductive connection pattern M1 in the even-numbered circuit group E1 is greater than a design area of the conductive connection pattern M1 in the odd-numbered row circuit group O1.

In the even-numbered row circuit group E1, the orthographic projection of the second conductive pattern Q2 on the substrate 101 covers the orthographic projection of the first extension pattern U1 on the substrate 101. Therefore, in the even-numbered row circuit group E1, the parasitic capacitance Ce at the second node N2 is related to an overlapping area of the orthographic projection of the second conductive pattern Q2 on the substrate 101 and the orthographic projections of the conductive connection pattern M1 and the first extension pattern U1 on the substrate 101. The overlapping area is greater than the overlapping area of the orthographic projections, on the substrate 101, of the first conductive pattern Q1 and the conductive connection pattern M1 in the odd-numbered row circuit group O1. Thus, the parasitic capacitance Ce at the second node N2 in the even-numbered row circuit group E1 is greater than the parasitic capacitance Co at the second node N2 in the odd-numbered row circuit group O1, which may solve the problem of difference in brightness of the light-emitting devices L driven by the odd-numbered row circuit group O1 and the even-numbered row circuit group E1.

It will be noted that, as shown in FIG. 14, in the even-numbered row circuit group E1 and the odd-numbered row circuit group O1, the orthographic projection of the shielding layer 11 on the substrate 101 overlaps with the orthographic projections of the conductive connection patterns M1 on the substrate 101, and the overlapping areas are the same. Therefore, in the even-numbered row circuit group E1 and the odd-numbered row circuit group O1, the parasitic capacitances created at the second nodes N2 are equal due to the shielding layer 11. As a result, the differential design of the parasitic capacitances at the second nodes N2 in the even-numbered row circuit group E1 and the odd-numbered row circuit group O1 is not affected.

Therefore, it will be understood that the conductive patterns Q are patterns designed to differentiate the parasitic capacitances at the second nodes N2 by comparing the even-numbered row circuit group E1 with the odd-numbered row circuit group O1.

Figure 15:
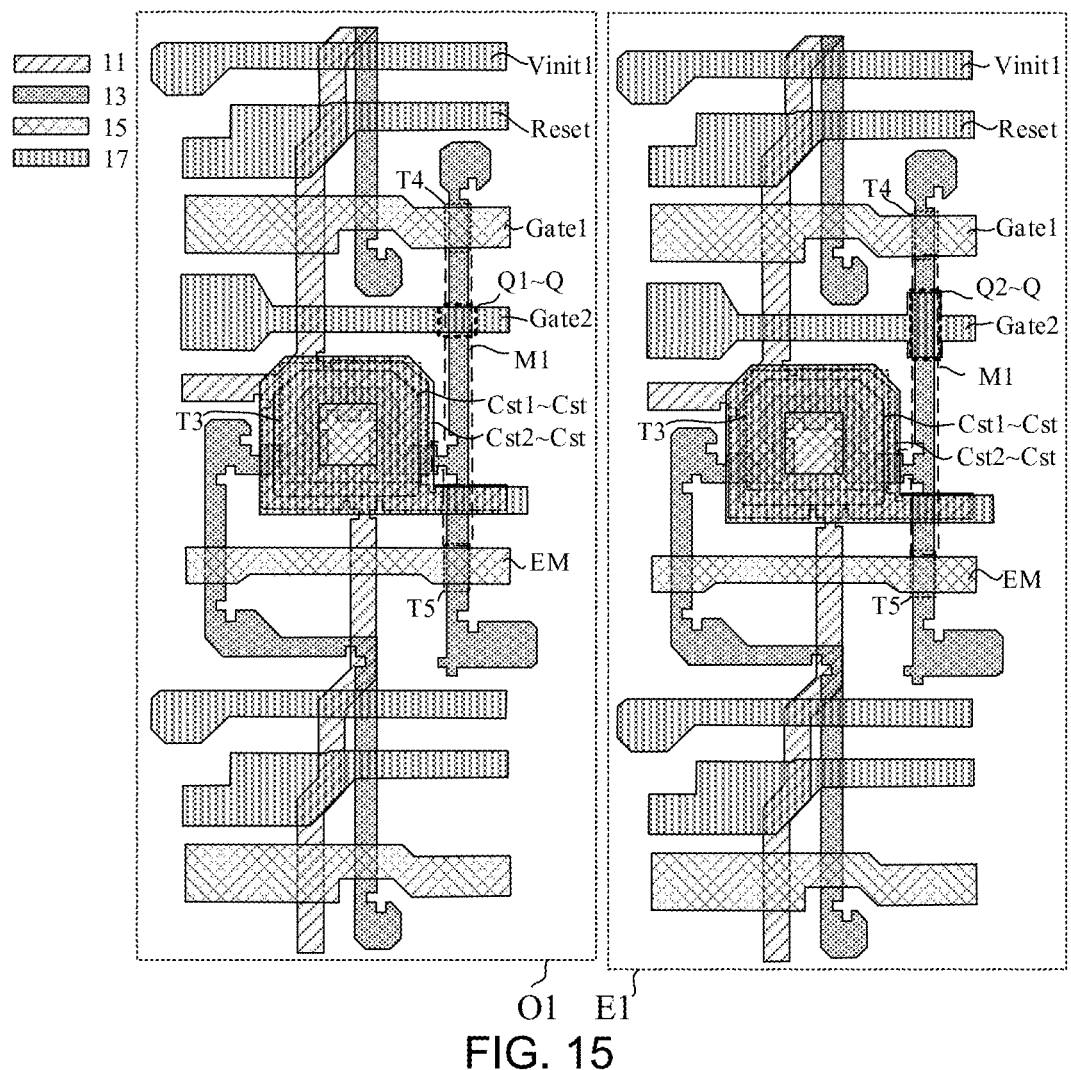
FIG. 15 is a diagram showing a structure of a shielding layer, a first semiconductor layer, a first gate conductive layer and a second gate conductive layer that are stacked, in accordance with yet some other embodiments of the present disclosure.

In some embodiments, as shown in FIG. 15, the array substrate 1 further includes a second gate conductive layer 17 disposed on a side of the first semiconductor layer 13 away from the substrate 101. The array substrate 1 further includes second scan signal lines Gate2, and the second scan signal lines Gate2 are located in the second gate conductive layer 17. The conductive pattern Q and the second scan signal line Gate2 are of a one-piece structure.

For example, as shown in FIG. 15, in the even-numbered row circuit group E1 and the odd-numbered row circuit group O1, the conductive connection patterns M1 have the same design shape and the same area. An orthographic projection of the second scan signal line Gate2 on the substrate 101 overlaps with the orthographic projection of the conductive connection pattern M1 on the substrate 101. An area of the first conductive pattern Q1 located in the second scan signal line Gate2 in the odd-numbered row circuit group O1 is less than an area of the second conductive pattern Q2 located in the second scan signal line Gate2 in the even-numbered row circuit group E1. Thus, the parasitic capacitance Ce at the second node N2 in the even-numbered row circuit group E1 is greater than the parasitic capacitance Co at the second node N2 in the odd-numbered row circuit group O1, which may solve the problem of difference in brightness of the light-emitting devices L driven by the odd-numbered row circuit group O1 and the even-numbered row circuit group E1.

It will be noted that, as shown in FIG. 15, in the even-numbered row circuit group E1 and the odd-numbered row circuit group O1, the orthographic projection of the shielding layer 11 on the substrate 101 overlaps with the orthographic projections of the conductive connection patterns M1 on the substrate 101, and the overlapping areas are the same; and the orthographic projections, on the substrate 101, of the second plates Cst2 located in the second gate conductive layer 17 respectively overlap with the orthographic projections, on the substrate 101, of the conductive connection patterns M1, and the overlapping areas are the same.

Therefore, in the even-numbered row circuit group E1 and the odd-numbered row circuit group O1, the shielding layer 11 causes the same parasitic capacitances to be created at the second nodes N2, and the second plates Cst2 cause the same parasitic capacitances to be created at the second nodes N2, neither of which affects the differential design of the parasitic capacitances at the second nodes N2 in the even-numbered row circuit group E1 and the odd-numbered row circuit group O1. Therefore, in the even-numbered row circuit group E1 and the odd-numbered row circuit group O1, overlapping portions of the orthographic projections, on the substrate 101, of the shielding layer 11 and the second electrode plates Cst2 and the orthographic projections, on the substrate 101, of the conductive connection patterns M1 are not referred to as the above-mentioned conductive patterns Q.

Figure 16:
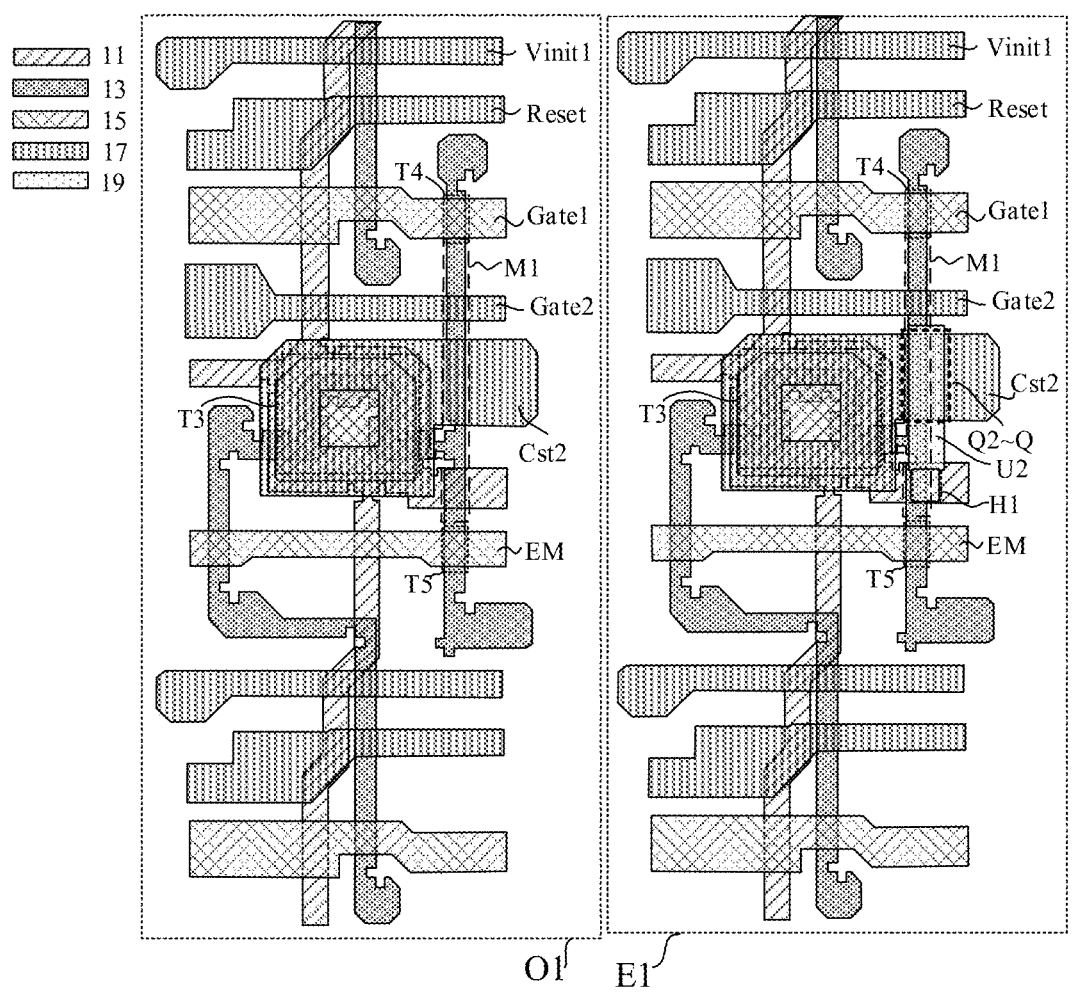
FIG. 16 is a diagram showing a structure of a shielding layer, a first semiconductor layer, a first gate conductive layer, a second gate conductive layer and a first source-drain metal layer that are stacked, in accordance with some embodiments of the present disclosure.

In some embodiments, as shown in FIG. 16, the array substrate 1 further includes: a second gate conductive layer 17 disposed on a side of the first semiconductor layer 13 away from the substrate 101, and a first source-drain metal layer 19 disposed on a side of the second gate conductive layer 17 away from the substrate 101. The first source-drain metal layer 19 includes second extension pattern(s) U2. The conductive pattern Q is located in the second gate conductive layer 17. In the even-numbered row circuit group E1, the second extension pattern U2 is connected to the conductive connection pattern M1 through a via hole H1.

For example, as shown in FIG. 16, in the even-numbered row circuit group E1, the second extension pattern U2 located in the first source-drain metal layer 19 is connected to the conductive connection pattern M1 located in the first semiconductor layer 13 through the via hole H1, which is equivalent to increasing the area of the conductive connection pattern M1. The second extension pattern U2 and the conductive connection pattern M1 have the same function, that is, they may create parasitic capacitances with the conductive pattern Q.

Therefore, as shown in FIG. 16, in the even-numbered row circuit group E1, the second conductive pattern Q2 is located in the second plate Cst2, and the second plate Cst2 is located in the second gate conductive layer 17. The second extension pattern U2 is connected to the conductive connection pattern M1, and the second plate Cst2 is located between the second extension pattern U2 and the conductive connection pattern M1. A parasitic capacitance is created between the conductive connection pattern M1 and the second conductive pattern Q2, and a parasitic capacitance is also created between the second extension pattern U2 and the second conductive pattern Q2, thereby realizing the purpose of increasing the parasitic capacitance Ce at the second node N2 in the even-numbered row circuit group E1.

For example, an overlapping area of the orthographic projection of the second extension pattern U2 in the odd-numbered row circuit group O1 on the substrate 101 and the orthographic projection of the second plate Cst2 on the substrate 101 may be less than an overlapping area of the orthographic projection of the second extension pattern U2 in the even-numbered row circuit group E1 on the substrate 101 and the orthographic projection of the second plate Cst2 on the substrate 101, so as to realize the differential design of the parasitic capacitances at the second nodes N2 in the even-numbered row circuit group E1 and the odd-numbered row circuit group O1.

For example, as shown in FIG. 16, there may be no second extension pattern U2 provided in the odd-numbered row circuit group O1. In this case, it may be considered that the second extension pattern U2 provided in the even-numbered row circuit group E1 causes the difference between the parasitic capacitances of the second nodes N2 in the even-numbered row circuit group E1 and the odd-numbered row circuit group O1.

Figure 17:
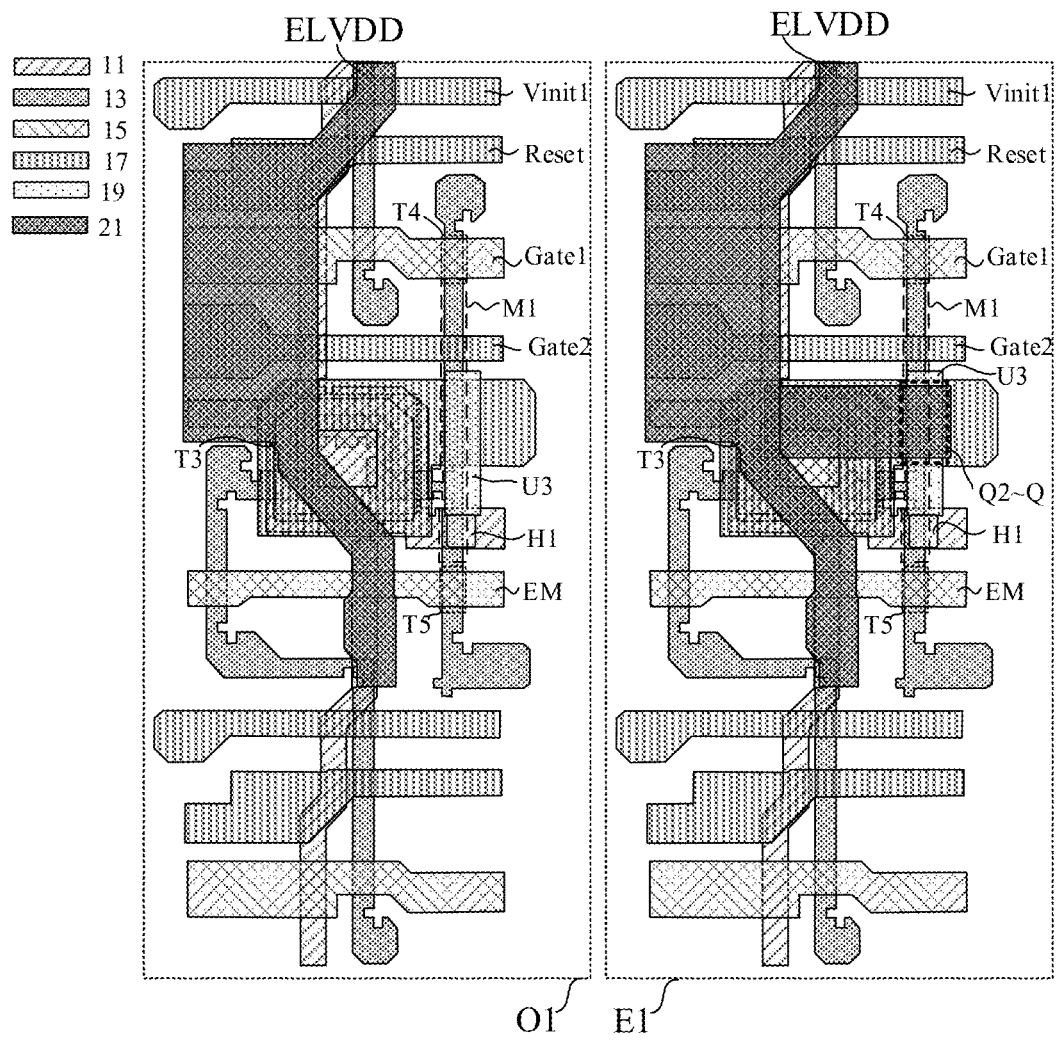
FIG. 17 is a diagram showing a structure of a shielding layer, a first semiconductor layer, a first gate conductive layer, a second gate conductive layer, a first source-drain metal layer and a second source-drain metal layer that are stacked, in accordance with some embodiments of the present disclosure.

In some embodiments, as shown in FIG. 17, the array substrate 1 further includes: a first source-drain metal layer 19 disposed on a side of the first semiconductor layer 13 away from the substrate 101, and the first source-drain metal layer 19 includes third extension pattern(s) U3. The third extension pattern U3 is connected to the conductive connection pattern M1 through a via hole H1.

For example, third extension patterns U3 are disposed in both the even-numbered row circuit group E1 and the odd-numbered row circuit group O1, and the third extension patterns U3 in the even-numbered row circuit group E1 and the odd-numbered row circuit group O1 have the same shape and the same area. The third extension pattern U3 is connected to the conductive connection pattern M1 through the via hole H1, thereby increasing the area of the conductive connection pattern M1. The third extension pattern U3 and the conductive connection pattern M1 have the same function, that is, they may create parasitic capacitances with the conductive pattern Q.

As shown in FIG. 17, the array substrate 1 further includes a second source-drain metal layer 21 disposed on a side of the first source-drain metal layer 19 away from the substrate 101, and the second source-drain metal layer 21 includes power supply signal lines ELVDD. The conductive pattern Q and the power supply signal line ELVDD are of a one-piece structure. An overlapping area of an orthographic projection of the third extension pattern U3 in the odd-numbered row circuit group O1 on the substrate 101 and the orthographic projection of the conductive pattern Q on the substrate 101 is less than an overlapping area of an orthographic projection of the third extension pattern U3 in the even-numbered row circuit group E1 on the substrate 101 and the orthographic projection of the conductive pattern Q on the substrate 101.

For example, as shown in FIG. 17, in the even-numbered row circuit group E1, the second conductive pattern Q2 and the power supply signal line ELVDD are of a one-piece structure, and the orthographic projection of the second conductive pattern Q2 on the substrate 101 overlaps with the orthographic projection of the third extension pattern U3 on the substrate 101. Therefore, a parasitic capacitance is created between the second conductive pattern Q2 and the third extension pattern U3, which realizes the purpose of increasing the parasitic capacitance Ce at the second node N2 in the even-numbered row circuit group E1.

In addition, as shown in FIG. 17, in the even-numbered row circuit group E1, a second gate conductive layer 17 is provided between the third extension pattern U3 and the first semiconductor layer 13, and an orthographic projection, on the substrate 101, of a pattern that is located in the second gate conductive layer 17 and connected to the second electrode plate Cst2 overlaps with both orthographic projections, on the substrate 101, of the third extension pattern U3 and the first semiconductor layer 13. Therefore, a parasitic capacitance is created between the first semiconductor layer 13 and the second plate Cst2, a parasitic capacitance is created between the second plate Cst2 and the third extension pattern U3, and a parasitic capacitance is created between the third extension pattern U3 and the second conductive pattern Q2, so that a multilayer capacitor is created.

In some embodiments, as shown in FIG. 17, in the odd-numbered row circuit group O1, the orthographic projection of the power supply signal line ELVDD on the substrate 101 does not overlap with the orthographic projection of the third extension pattern U3 on the substrate 101.

For example, as shown in FIG. 17, by comparing the power supply signal line ELVDD in the even-numbered row circuit group E1 with the power supply signal line ELVDD in the odd-numbered row circuit group O1, the orthographic projection of the power supply signal line ELVDD in the even-numbered row circuit group E1 overlaps with the orthographic projection of the third extension pattern U3 on the substrate 101, and the orthographic projection of the power supply signal line ELVDD in the odd-numbered row circuit group O1 on the substrate 101 does not overlap with the orthographic projection of the third extension pattern U3 on the substrate 101. Thereby, the purpose of increasing the parasitic capacitance Ce at the second node N2 in the even-numbered row circuit group E1 is realized.

For example, as shown in FIG. 17, the orthographic projection of the third extension pattern U3 on the substrate 101 overlaps with the orthographic projection of the conductive connection pattern M1 on the substrate 101. The third extension pattern U3 is connected to the conductive connection pattern M1 through the via hole H1, so that the second electrode Cst2 arranged between the third extension pattern U3 and the conductive connection pattern M1 creates a parasitic capacitance with each of the third extension pattern U3 and the conductive connection pattern M1, which is conducive to increasing the parasitic capacitance at the second node N2 in the pixel driving circuit 10.

Figure 18:
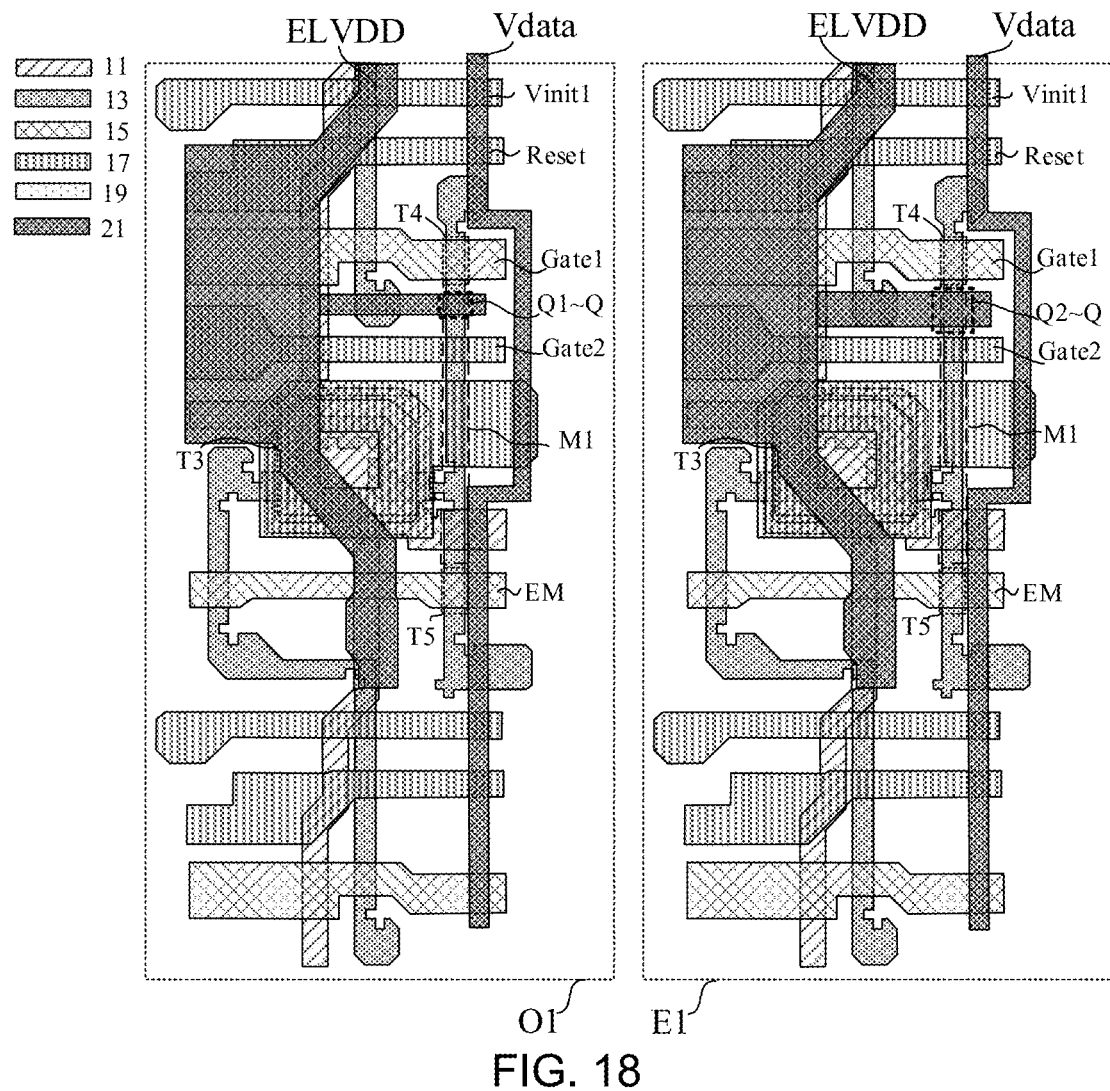
FIG. 18 is a diagram showing a structure of a shielding layer, a first semiconductor layer, a first gate conductive layer, a second gate conductive layer, a first source-drain metal layer and a second source-drain metal layer that are stacked, in accordance with some other embodiments of the present disclosure.

In some embodiments, as shown in FIG. 18, the array substrate 1 further includes: a first source-drain metal layer 19 disposed on a side of the first semiconductor layer 13 away from the substrate 101, and a second source-drain metal layer 21 disposed on a side of the first source-drain metal layer 19 away from the substrate 101. The second source-drain metal layer 21 includes data signal lines Vdata and power supply signal lines ELVDD. The conductive pattern Q and the power supply signal line ELVDD are of a one-piece structure.

The overlapping area of the orthographic projections, on the substrate 101, of the first conductive pattern and the conductive connection pattern M1 in the odd-numbered row circuit group O1 is less than the overlapping area of the orthographic projections, on the substrate 101, of the second conductive pattern Q2 and the conductive connection pattern M1 in the even-numbered row circuit group E1. In order to avoid the influence of the data signal line Vdata, the data signal line Vdata has an avoidance design, so that the orthographic projection of the data signal line Vdata on the substrate 101 does not overlap with the orthographic projection of the conductive connection pattern M1 on the substrate 101.

In some examples, the conductive pattern Q is a pattern in the pixel driving circuit 10 that is located in a different layer from the conductive connection pattern M1. For example, the conductive pattern Q is electrically connected to the reference voltage line ELVSS, the conductive pattern Q is electrically connected to the first initial signal line Vinit1, the conductive pattern Q is electrically connected to the second initial signal line Vinit2, or the conductive pattern Q is electrically connected to another constant voltage line, which is not limited herein.

In combination with the above introduction about the conductive connection pattern M1 and the conductive pattern Q, another film layer design of the array substrate 1 will be illustrated below.

Figure 19:
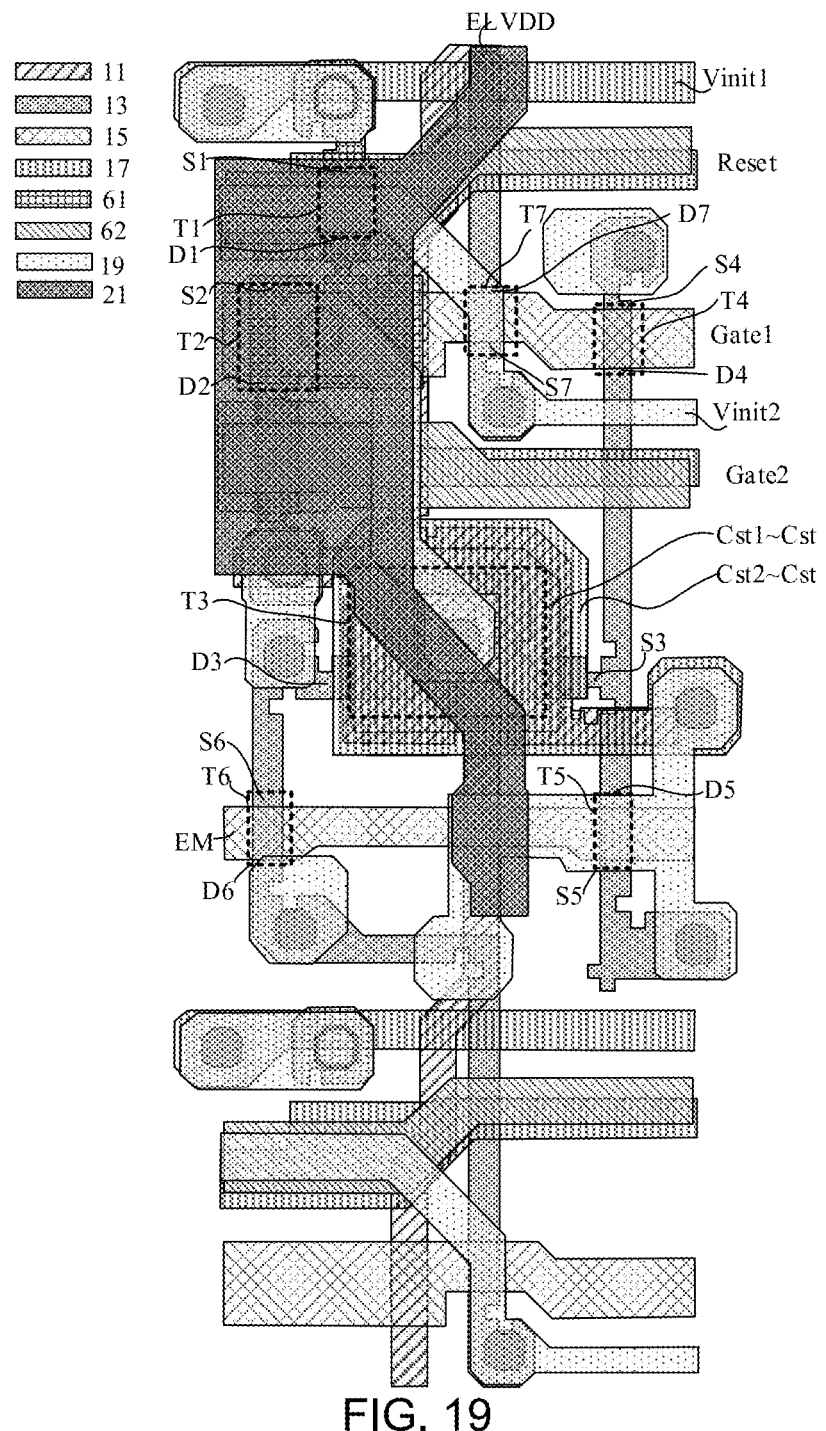
FIG. 19 is a diagram showing a structure of a shielding layer, a first semiconductor layer, a first gate conductive layer, a second gate conductive layer, a second semiconductor layer, a third gate conductive layer, a first source-drain metal layer and a second source-drain metal layer that are stacked, in accordance with some embodiments of the present disclosure.

In some embodiments, as shown in FIG. 19, the transistors include: a first reset transistor T1, a compensation transistor T2, a second light-emitting control transistor T6, and a second reset transistor T7. The array substrate 1 further includes: first initial signal lines Vinit1, second initial signal lines Vinit2, data signal lines Vdata, and power supply signal lines ELVDD.

The first electrode region S1 of the first reset transistor T1 is electrically connected to the first initial signal line Vinit1, the second electrode region D1 of the first reset transistor T1 is electrically connected to the first electrode region S2 of the compensation transistor T2, and the second electrode region D2 of the compensation transistor T2 is electrically connected to the second electrode region D3 of the driving transistor T3. The first electrode region S6 of the second light-emitting control transistor T6 is electrically connected to the second electrode region D3 of the driving transistor T3, the second electrode region D6 of the second light-emitting control transistor T6 is electrically connected to the second electrode region D7 of the second reset transistor T7, the first electrode region S7 of the second reset transistor T7 is electrically connected to the second initial signal line Vinit2, the first electrode region S4 of the data writing transistor T4 is electrically connected to the data signal line Vdata, and the first electrode region S5 of the first light-emitting control transistor T5 is electrically connected to the power supply signal line ELVDD.

For example, as shown in FIG. 9, the array substrate 1 further includes: a gate pattern G1 of the first reset transistor T1, reset signal lines Reset, a gate pattern G7 of the second reset transistor T7, first scan signal lines Gate1, a gate pattern G5 of the first light-emitting control transistor T5, a gate pattern G6 of the second light-emitting control transistor T6, and light-emitting control signal lines EM. The gate pattern G1 of the first reset transistor T1 is electrically connected to the reset signal line Reset. The gate pattern G7 of the second reset transistor T7 is electrically connected to the first scan signal line Gate1. The gate pattern G5 of the first light-emitting control transistor T5 and the gate pattern G6 of the second light-emitting control transistor T6 are electrically connected to the light-emitting control signal line EM.

For example, as shown in FIG. 19, the array substrate 1 includes: a first semiconductor layer 13 disposed on a side of the substrate 101, and the conductive connection patterns M1 are located in the first semiconductor layer 13. The array substrate 1 includes: a first gate conductive layer 15 disposed on a side of the first semiconductor layer 13 away from the substrate 101, and first scan signal lines Gate1 and light-emitting control signal lines EM are located in the first gate conductive layer 15. The array substrate 1 includes: a second gate conductive layer 17 disposed on a side of the first gate conductive layer 15 away from the substrate 101, and first initial signal lines Vinit1 and reset signal lines Reset are located in the second gate conductive layer 17. The array substrate 1 includes: a first source-drain metal layer 19 disposed on a side of the second gate conductive layer 17 away from the substrate 101, and second initial signal lines Vinit2 are located in the first source-drain metal layer 19. The array substrate 1 includes: a second source-drain metal layer 21 disposed on a side of the first source-drain metal layer 19 away from the substrate, and data signal lines Vdata and power supply signal lines ELVDD are located in the second source-drain metal layer 21.

In some embodiments, as shown in FIGS. 9 and 19, the compensation transistor T2 and the first reset transistor T1 are oxide thin film transistors. For example, the compensation transistor T2 and the first reset transistor T1 are N-type oxide thin film transistors. The array substrate 1 further includes: a second semiconductor layer 61 and a third gate conductive layer 62 disposed between the second gate conductive layer 17 and the first source-drain metal layer 19. The third gate conductive layer 62 is disposed on a side of the second semiconductor layer 61 away from the substrate 101.

For example, a material of the second semiconductor layer 61 includes, but is not limited to, indium gallium zinc oxide. Channel portions of the compensation transistor T2 and the first reset transistor T1 are located in the second semiconductor layer 61, and the gate patterns of the compensation transistor T2 and the first reset transistor T1 are located in the third gate conductive layer 62.

Some embodiments of the present disclosure further provide an array substrate 1. As shown in FIGS. 4 and 5, the array substrate 1 includes a substrate 101 and a plurality of pixel driving circuits 10 disposed on the substrate 101. As shown in FIG. 5, each of the plurality of pixel driving circuits 10 includes transistors, and the transistors include a driving transistor T3, a data writing transistor T4, and a first light-emitting control transistor T5.

The array substrate 1 further includes: first electrode regions and second electrode regions of the transistors. A first electrode region S3 of the driving transistor T3, a second electrode region D4 of the data writing transistor T4 and a second electrode region D5 of the first light-emitting control transistor T5 are connected through a conductive connection pattern M1, and the conductive connection pattern M1 is a continuous pattern.

As shown in FIG. 4, the plurality of pixel driving circuits 10 are configured as odd-numbered row circuit groups O1 and even-numbered row circuit groups E1. The odd-numbered row circuit group O1 and the even-numbered row circuit group E1 each include a plurality of pixel driving circuits 10 arranged in a first direction X. The odd-numbered row circuit groups O1 and the even-numbered row circuit groups E1 are alternately arranged in a second direction Y. The first direction X and the second direction Y intersect.

As shown in FIGS. 6, 11, and 13 to 17, the array substrate 1 further includes: conductive patterns Q, and the conductive patterns Q include a pattern in the pixel driving circuit 10 that is located in a different layer from the conductive connection pattern M1. A value of a capacitance Co created by a conductive connection pattern M1 and a conductive pattern Q in at least one pixel driving circuit 10 in the odd-numbered row circuit group O1 is less than a value of a capacitance Ce created by a conductive connection pattern M1 and a conductive pattern Q in at least one pixel driving circuit 10 in the even-numbered row circuit group E1.

For example, insulating layer(s) are provided between all functional film layers of the array substrate 1. By adjusting the difference between the insulating layers, it may be possible to realize a differential design of the value of the capacitance Co created by the conductive connection pattern M1 and the conductive pattern Q in the odd-numbered row circuit group O1 and the value (i.e., the capacitance value) of the capacitance Ce created by the conductive connection pattern M1 and the conductive pattern Q in the even-numbered row circuit group E1.

In some embodiments, a material of an insulating layer between the conductive connection pattern M1 and the conductive pattern Q in at least one pixel driving circuit 10 in the odd-numbered row circuit group O1 is the same as a material of an insulating layer between the conductive connection pattern M1 and the conductive pattern Q in at least one pixel driving circuit 10 in the even-numbered row circuit group E1.

For example, a thickness of the insulating layer between the conductive connection pattern M1 and the conductive pattern Q in the odd-numbered row circuit group O1 may be greater than a thickness of the insulating layer between the conductive connection pattern M1 and the conductive pattern Q in the even-numbered row circuit group E1. Therefore, the value of the capacitance Co created by the conductive connection pattern M1 and the conductive pattern Q in the odd-numbered row circuit group O1 is less than the value of the capacitance Ce created by the conductive connection pattern M1 and the conductive pattern Q in the even-numbered row circuit group E1.

In some embodiments, the insulating layer between the conductive connection pattern M1 and the conductive pattern Q in at least one pixel driving circuit 10 in the odd-numbered row circuit group O1 and the insulating layer between the conductive connection pattern M1 and the conductive pattern Q in at least one pixel driving circuit 10 in the even-numbered row circuit group E1 include at least one insulating layer of the same material.

For example, by adjusting the difference between the material of the insulating layer between the conductive connection pattern M1 and the conductive pattern Q in the odd-numbered row circuit group O1 and the material of the insulating layer between the conductive connection pattern M1 and the conductive pattern Q in the even-numbered row circuit group E1, it may be possible to realize the differential design of the value of the capacitance Co created by the conductive connection pattern M1 and the conductive pattern Q in the odd-numbered row circuit group O1 and the value of the capacitance Ce created by the conductive connection pattern M1 and the conductive pattern Q in the even-numbered row circuit group E1. Furthermore, at least one insulating layer in the odd-numbered row circuit group O1 and at least one insulating layer the even-numbered row circuit group E1 are made of the same material, which may reduce the process steps for forming the film layers in the array substrate 1.

Figure 20:
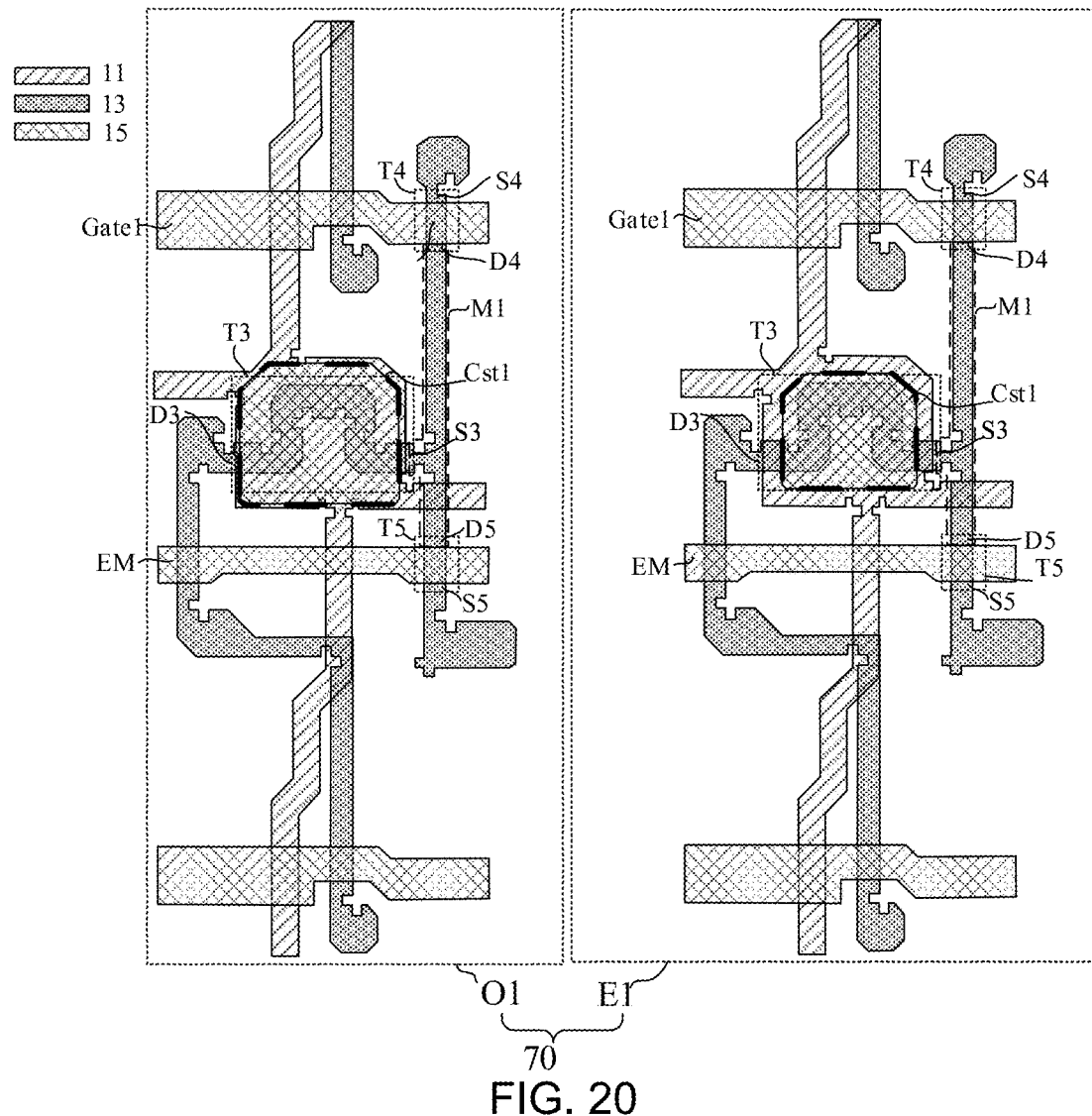
FIG. 20 is a diagram showing a structure of a first semiconductor layer, a first gate conductive layer, and a second gate conductive layer that are stacked, in accordance with yet some other embodiments of the present disclosure.

In some embodiments, as shown in FIG. 11, the array substrate 1 further includes: a first gate conductive layer 15 disposed on a side of the first semiconductor layer 13 away from the substrate 101, and a second gate conductive layer 17 disposed on a side of the first gate conductive layer 15 away from the substrate 101. As shown in FIG. 9, the pixel driving circuit 10 further includes a capacitor Cst, the capacitor Cst includes a first plate Cst1 and a second plate Cst2, the first plate Cst1 is located in the first gate conductive layer 15, and the second plate Cst2 is located in the second gate conductive layer 17. As shown in FIG. 20, a capacitance value of the capacitor Cst in the odd-numbered row circuit group O1 is greater than a capacitance value of the capacitor Cst in the even-numbered row circuit group E1.

That is to say, the storage capacitance of the capacitor Cst in the odd-numbered row circuit group O1 is greater than the storage capacitance of the capacitor Cst in the even-numbered row circuit group E1, which facilitates fast input of the data signal into the first node N1 in the even-numbered row circuit group E1 and makes up for the problem of insufficient duration b for writing the data signal into the first node N1 and threshold compensation in the even-numbered row circuit group E1.

For example, as shown in FIG. 20, an area of the orthographic projection, on the substrate 101, of the first plate Cst1 of the capacitor Cst in the odd-numbered row circuit group O1 is greater than an area of the orthographic projection, on the substrate 101, of the first plate Cst1 of the capacitor Cst in the even-numbered row circuit group E1. Thus, it realizes the purpose that the capacitance value of the capacitor Cst in the odd-numbered row circuit group O1 is greater than the capacitance value of the capacitor Cst in the even-numbered row circuit group E1.

Figure 21:
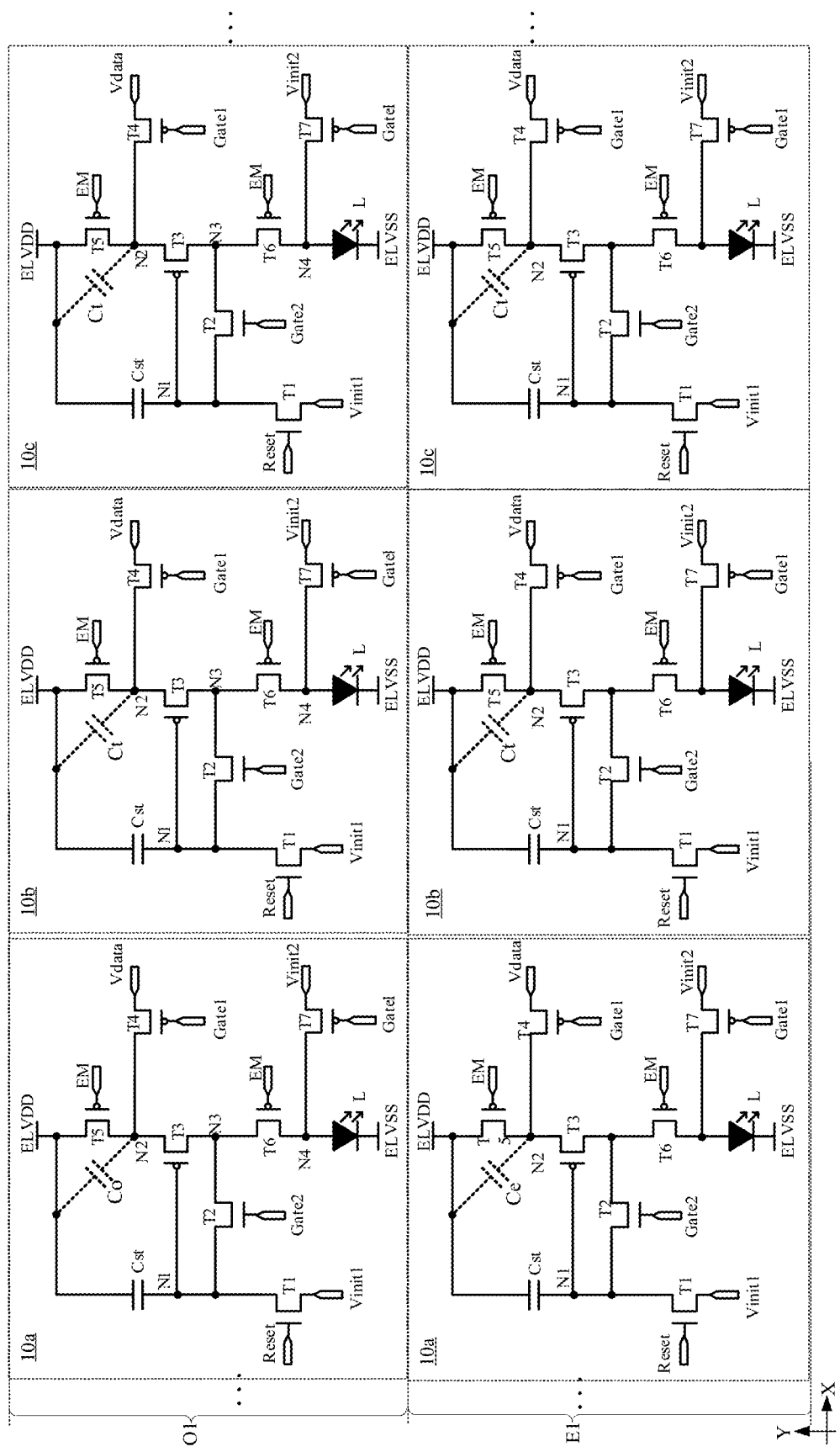
FIG. 21 is an equivalent circuit diagram of yet another pixel driving circuit, in accordance with some embodiments of the present disclosure.

In some embodiments, as shown in FIG. 21, the pixel driving circuits 10 disposed on the array substrate 1 are used to drive the light-emitting devices L that emit light of different colors. The plurality of pixel driving circuits 10 include first pixel driving circuits 10a, second pixel driving circuits 10b and third pixel driving circuits 10c. For example, the first pixel driving circuits 10a are used to drive light-emitting devices L that emits green light, the second pixel driving circuits 10b are used to drive light-emitting devices L that emits red light, and the third pixel driving circuits 10c are used to drive light-emitting devices L that emits blue light.

As shown in FIG. 21, since the green light emitted by the light-emitting device L emitting green light is brighter, the parasitic capacitances Ct at the second nodes N2 in the first pixel driving circuits 10a in the odd and even row may be designed differently. For example, the value of the parasitic capacitance Co at the second node N2 of the first pixel driving circuit 10a in the odd-numbered row circuit group O1 is less than the value of the parasitic capacitance Ce at the second node N2 of the first pixel driving circuit 10a in the even-numbered row circuit group E1.

The parasitic capacitances Ct at the second nodes N2 in the second pixel driving circuit 10b and the third pixel driving circuit 10c are not designed differently. For example, in the odd-numbered row circuit group O1 and the even-numbered row circuit group E1, the parasitic capacitances Ct at the second nodes N2 in the second pixel driving circuit 10b and the third pixel driving circuit 10c are equal. Alternatively, the parasitic capacitances Ct at the second nodes N2 in the second pixel driving circuit 10b and the third pixel driving circuit 10c are designed differently based on the chromaticity of the light-emitting device L emitting red light and the light-emitting device L emitting blue light.

As for the differential design solution of the parasitic capacitances Ct at the second nodes N2, reference may be made to the above description, and details will not be repeated here.

In some embodiments, the light-emitting device L emitting green light has a higher turn-on voltage; therefore, to eliminate the problem of uneven display brightness caused by brightness difference, the following two examples are provided.

Figure 22:
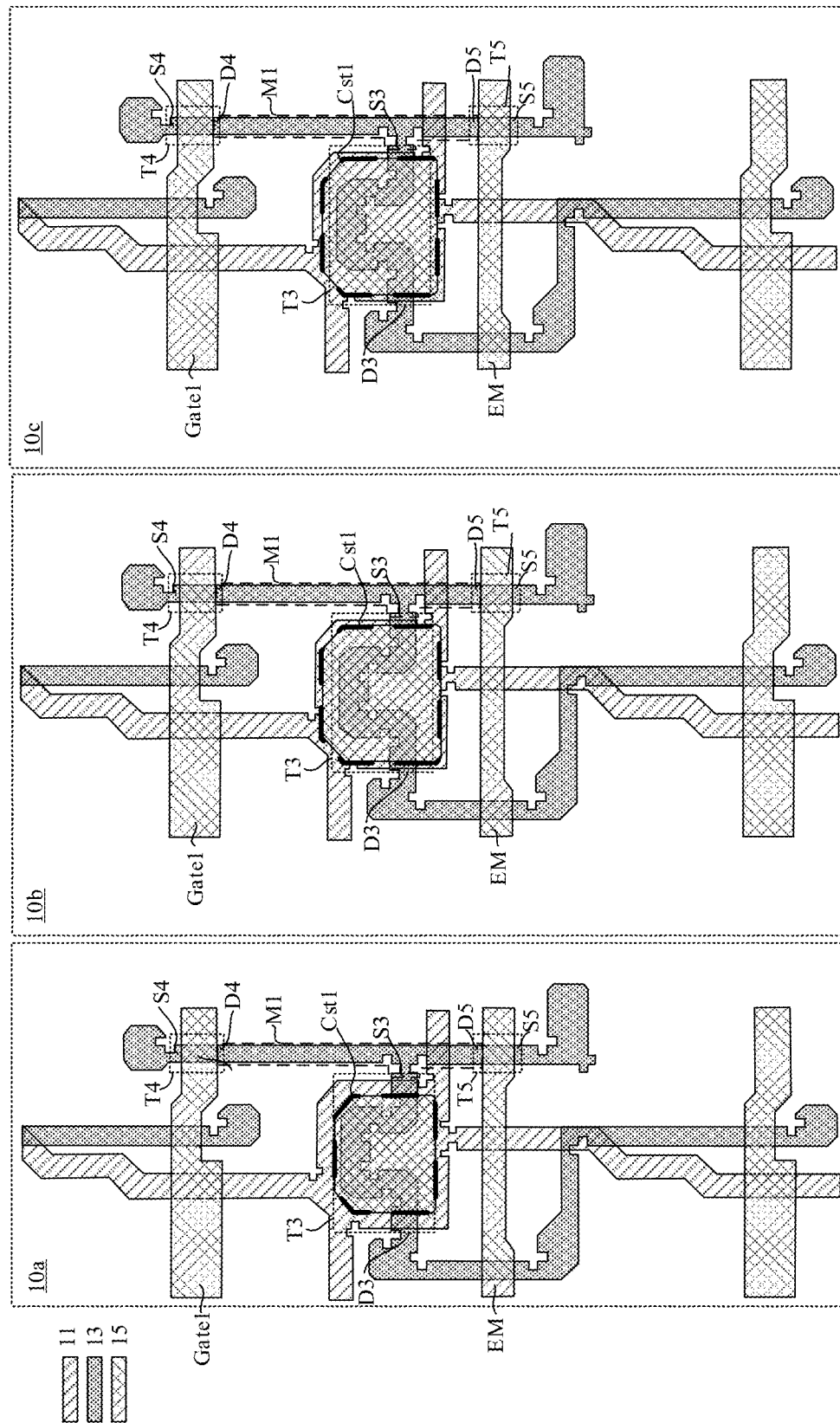
FIG. 22 is a diagram showing a structure of a first semiconductor layer, a first gate conductive layer, and a second gate conductive layer that are stacked, in accordance with yet some other embodiments of the present disclosure.

For example, as shown in FIG. 22, in the same row circuit group, the capacitance value of the capacitor Cst in the first pixel driving circuit 10a is less than the capacitance value of the capacitor Cst in the second pixel driving circuit 10b and the capacitance value of the capacitor Cst in the third pixel driving circuit 10c. For example, an area of an orthographic projection, on the substrate 101, of the first plate Cst1 of the capacitor Cst in the first pixel driving circuit 10a is less than an area of an orthographic projection, on the substrate 101, of the first plate Cst1 of the capacitor Cst in the second pixel driving circuit 10b, and is less than an area of an orthographic projection, on the substrate 101, of the first plate Cst1 of the capacitor Cst in the third pixel driving circuit 10c on the substrate 101.

Figure 23:
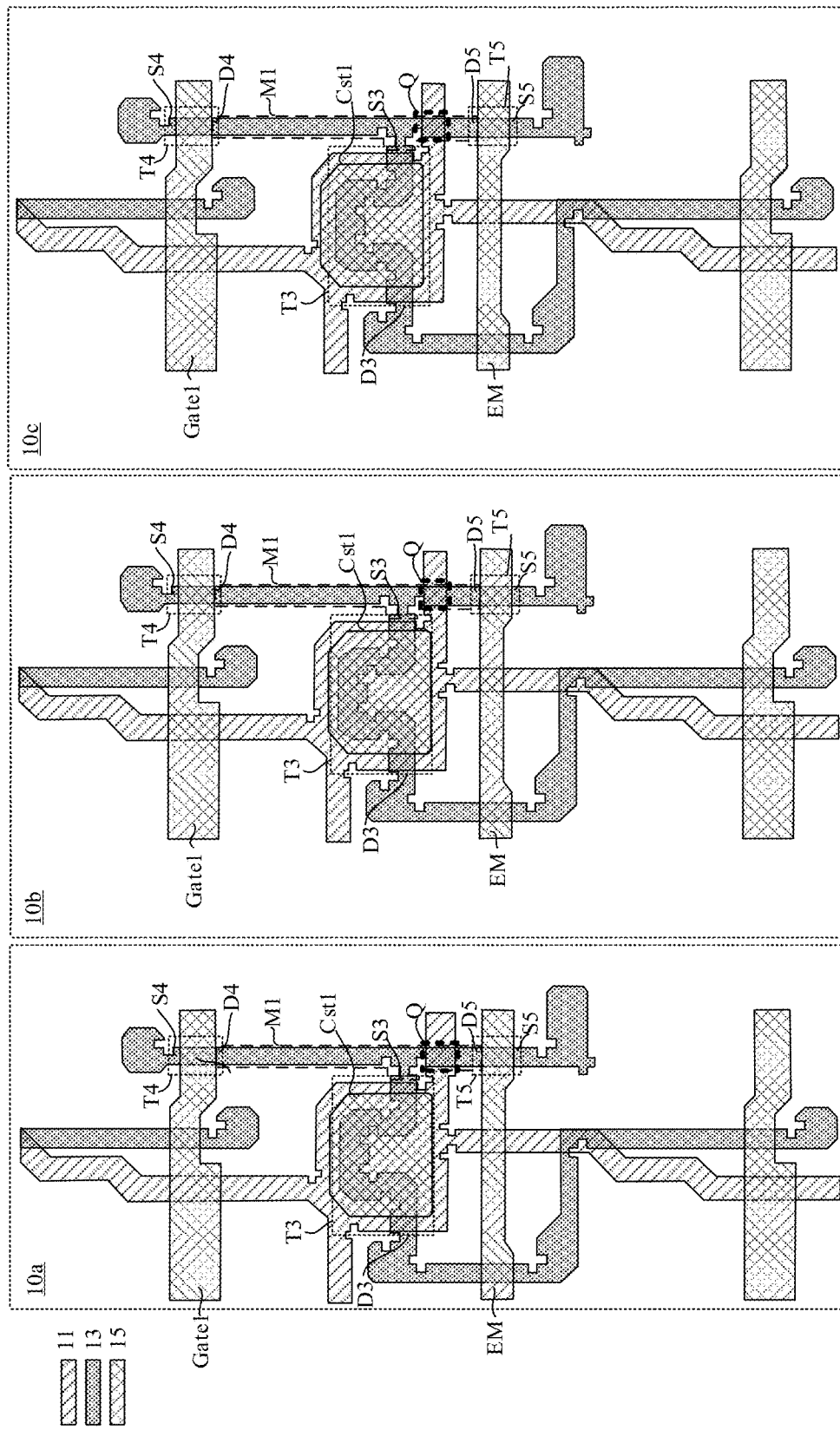
FIG. 23 is a diagram showing a structure of a first semiconductor layer, a first gate conductive layer, and a second gate conductive layer that are stacked, in accordance with yet some other embodiments of the present disclosure.

For example, as shown in FIG. 23, in the same row circuit group, the value of the parasitic capacitance Ct at the second node N2 in the first pixel driving circuit 10a is greater than the value of the parasitic capacitance Ct at the second node N2 in the second pixel driving circuit 10b, and is greater than the value of the parasitic capacitance Ct at the second node N2 in the third pixel driving circuit 10c. For example, an overlapping area of orthographic projections, on the substrate 101, of the conductive pattern Q and the conductive connection pattern M1 in the first pixel driving circuit 10a is greater than an overlapping area of orthographic projections, on the substrate 101, of the conductive pattern Q and the conductive connection pattern M1 in the second pixel driving circuit 10b, and is greater than an overlapping area of orthographic projections, on the substrate 101, of the conductive pattern Q and the conductive connection pattern M1 in the third pixel driving circuit 10c.

Figure 24:
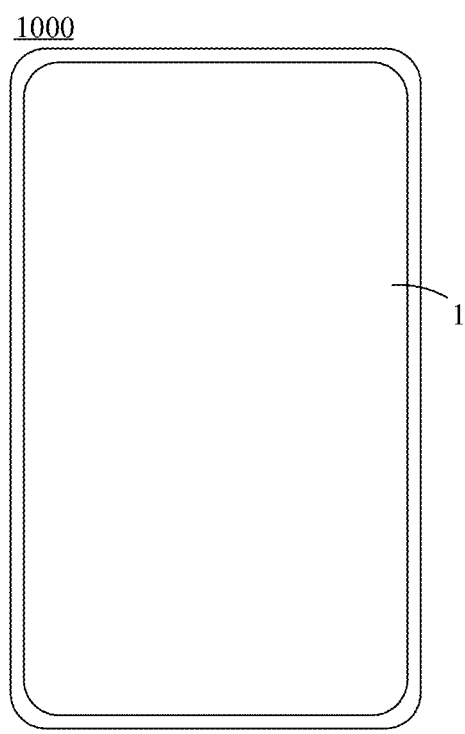
FIG. 24 is a structural diagram of a display device, in accordance with some embodiments of the present disclosure.

Some embodiments of the present disclosure provide a display device 1000, and as shown in FIG. 24, the display device 1000 includes the array substrate 1 as described in any of the above embodiments.

The display device provided in the embodiments of the present disclosure may be any device that displays images whether in motion (e.g., videos) or stationary (e.g., still images) and whether textual or graphical. More specifically, it is expected that the embodiments may be implemented in or associated with a plurality of electronic devices. The plurality of electronic devices may include (but is not limit to), for example, mobile telephones, wireless devices, personal data assistants (PDAs), hand-held or portable computers, GPS receivers/navigators, cameras, MP4 video players, video cameras, game consoles, watches, clocks, calculators, TV monitors, flat panel displays, computer monitors, car displays (such as odometer displays), navigators, cockpit controllers and/or displays, camera view displays (such as rear view camera displays in vehicles), electronic photos, electronic billboards or indicators, projectors, building structures, packagings and aesthetic structures (such as a display for an image of a piece of jewelry).

The foregoing descriptions are merely specific implementation manners of the present disclosure, but the protection scope of the present disclosure is not limited thereto, any changes or replacements that a person skilled in the art could conceive of within the technical scope of the present disclosure shall be included in the protection scope of the present disclosure. Therefore, the protection scope of the present disclosure shall be subject to the protection scope of the claims.

What is claimed is:

1. An array substrate, comprising: a substrate and a plurality of pixel driving circuits disposed on the substrate, wherein
    each pixel driving circuit of the plurality of pixel driving circuits includes transistors, and the transistors include a driving transistor, a data writing transistor and a first light-emitting control transistor;
    the array substrate further comprises: first electrode regions and second electrode region of the transistors; a first electrode region of the driving transistor, a second electrode region of the data writing transistor and a second electrode region of the first light-emitting control transistor are connected through a conductive connection pattern, and the conductive connection pattern is a continuous pattern;
    the plurality of pixel driving circuits are configured as: odd-numbered row circuit groups and even-numbered row circuit groups; the odd-numbered row circuit groups and the even-numbered row circuit groups each include pixel driving circuits arranged in a first direction; the odd-numbered row circuit groups and the even-numbered row circuit groups are alternately arranged in a second direction; the first direction and the second direction intersect;
    the array substrate further comprises conductive patterns; the conductive patterns include a pattern in the pixel driving circuit that is located in a different layer from the conductive connection pattern;
    an overlapping area of orthographic projections, on the substrate, of a conductive connection pattern and a conductive pattern in at least one pixel driving circuit in an odd-numbered row circuit group is less than an overlapping area of orthographic projections, on the substrate, of a conductive connection pattern and a conductive pattern in at least one pixel driving circuit in an even-numbered row circuit group.

2. The array substrate according to claim 1, wherein the transistors further include a compensation transistor;
    the array substrate further comprises: a gate pattern of the compensation transistor and second scan signal lines; the gate pattern of the compensation transistor is electrically connected to a second scan signal line; a second electrode region of the compensation transistor is connected to a second electrode region of the driving transistor;
    the plurality of pixel driving circuits are further configured as: a plurality of pixel group units sequentially arranged in the second direction; each pixel group unit of the plurality of pixel group units includes: an odd-numbered row circuit group and an even-numbered row circuit group arranged adjacent to the odd-numbered row circuit group; each pixel group unit shares one second scan signal line.

3. The array substrate according to claim 1, further comprising: a first semiconductor layer disposed on the substrate, the conductive connection pattern being located in the first semiconductor layer.

4. The array substrate according to claim 1, further comprising: a shielding layer located on the substrate, and a first semiconductor layer disposed on a side of the shielding layer away from the substrate;
    the conductive pattern being located in the shielding layer.

5. The array substrate according to claim 3, further comprising: a shielding layer located between on the substrate and the first semiconductor layer, a first gate conductive layer disposed on a side of the first semiconductor layer away from the substrate, and a second gate conductive layer disposed on a side of the first gate conductive layer away from the substrate, wherein the pixel driving circuit further includes a capacitor and a compensation transistor;
    the capacitor includes a first plate and a second plate; the first plate is located in the first gate conductive layer, and the second plate is located in the second gate conductive layer; the first plate is electrically connected to a first electrode region of the compensation transistor, and the second plate is electrically connected to a power supply signal line;
    the conductive pattern includes: a first portion located in the shielding layer and a second portion electrically connected to the second plate.

6. The array substrate according to claim 3, further comprising: a first gate conductive layer disposed on a side of the first semiconductor layer away from the substrate, and a second gate conductive layer disposed on a side of the first gate conductive layer away from the substrate; the conductive pattern being located in the second gate conductive layer.

7. The array substrate according to claim 6, wherein an area of an orthographic projection, on the substrate, of the conductive pattern in the odd-numbered row circuit group is equal to an area of an orthographic projection, on the substrate, of the conductive pattern in the even-numbered row circuit group;
    in the even-numbered row circuit group, the conductive connection pattern is connected to a first extension pattern located in the first semiconductor layer, and the orthographic projection, on the substrate, of the conductive pattern covers an orthographic projection, on the substrate, of the first extension pattern.

8. The array substrate according to claim 3, further comprising:
    a second gate conductive layer disposed on a side of the first semiconductor layer away from the substrate; and
    second scan signal lines, the second scan signal lines being located in the second gate conductive layer;
    wherein a conductive pattern and a second scan signal line are of a one-piece structure.

9. The array substrate according to claim 3, further comprising:
    a first source-drain metal layer disposed on a side of the first semiconductor layer away from the substrate, wherein the first source-drain metal layer includes third extension patterns, and a third extension pattern is connected to the conductive connection pattern through a via hole; and
    a second source-drain metal layer disposed on a side of the first source-drain metal layer away from the substrate, the second source-drain metal layer including power supply signal lines;

wherein a conductive pattern and a power supply signal line are of a one-piece structure; an overlapping area of orthographic projections, on the substrate, of a third extension pattern and the conductive pattern in the odd-numbered row circuit group is less than an overlapping area of orthographic projections, on the substrate, of a third extension pattern and the conductive pattern in the even-numbered row circuit group.

10. The array substrate according to claim 9, wherein in the odd-numbered row circuit group, an orthographic projection of a power supply signal line on the substrate does not overlap with an orthographic projection of the third extension pattern on the substrate.

11. The array substrate according to claim 9, wherein an orthographic projection of the third extension pattern on the substrate overlaps with an orthographic projection of the conductive connection pattern on the substrate.

12. The array substrate according to claim 1, wherein
the transistors further include: a first reset transistor, a compensation transistor, a second light-emitting control transistor and a second reset transistor;
the array substrate further comprises: first initial signal lines, second initial signal lines, data signal lines and power supply signal lines;
a first electrode region of the first reset transistor is electrically connected to a first initial signal line, a second electrode region of the first reset transistor is electrically connected to a first electrode region of the compensation transistor, and a second electrode region of the compensation transistor is electrically connected to a second electrode region of the driving transistor; a first electrode region of the second light-emitting control transistor is electrically connected to the second electrode region of the driving transistor, a second electrode region of the second light-emitting control transistor is electrically connected to a second electrode region of the second reset transistor, and a first electrode region of the second reset transistor is electrically connected to a second initial signal line; a first electrode region of the data writing transistor is electrically connected to a data signal line; and a first electrode region of the first light-emitting control transistor is electrically connected to a power supply signal line.

13. The array substrate according to claim 12, further comprising: a gate pattern of the first reset transistor, reset signal lines, a gate pattern of the second reset transistor, first scan signal lines, a gate pattern of the first light-emitting control transistor, a gate pattern of the second light-emitting control transistor, and light-emitting control signal lines, wherein
the gate pattern of the first reset transistor is electrically connected to a reset signal line, the gate pattern of the second reset transistor is electrically connected to a first scan signal line, and the gate pattern of the first light-emitting control transistor and the gate pattern of the second light-emitting control transistor are electrically connected to the light-emitting control signal line.

14. The array substrate according to claim 13, further comprising:
a first semiconductor layer disposed on a side of the substrate, the conductive connection pattern being located in the first semiconductor layer;
a first gate conductive layer disposed on a side of the first semiconductor layer away from the substrate, the first scan signal lines and the light-emitting control signal lines being located in the first gate conductive layer;
a second gate conductive layer disposed on a side of the first gate conductive layer away from the substrate, the first initial signal lines and the reset signal lines being located in the second gate conductive layer;
a first source-drain metal layer disposed on a side of the second gate conductive layer away from the substrate, the second initial signals being located in the first source-drain metal layer; and
a second source-drain metal layer disposed on a side of the first source-drain metal layer away from the substrate, the data signal lines and the power supply signal lines being located in the second source-drain metal layer.

15. The array substrate according to claim 14, wherein the compensation transistor and the first reset transistor are oxide thin film transistors;
the array substrate further comprises: a second semiconductor layer and a third gate conductive layer disposed between the second gate conductive layer and the first source-drain metal layer, the third gate conductive layer being disposed on a side of the second semiconductor layer away from the substrate.

16. A display device, comprising the array substrate according to claim 1.

17. An array substrate, comprising: a substrate and a plurality of pixel driving circuits disposed on the substrate, wherein
each pixel driving circuit of the plurality of pixel driving circuits includes transistors, and the transistors include a driving transistor, a data writing transistor and a first light-emitting control transistor;
the array substrate further comprises: first electrode regions and second electrode region of the transistors; a first electrode region of the driving transistor, a second electrode region of the data writing transistor and a second electrode region of the first light-emitting control transistor are connected through a conductive connection pattern, and the conductive connection pattern is a continuous pattern;
the plurality of pixel driving circuits are configured as: odd-numbered row circuit groups and even-numbered row circuit groups; the odd-numbered row circuit groups and the even-numbered row circuit groups each include pixel driving circuits arranged in a first direction;
the odd-numbered row circuit groups and the even-numbered row circuit groups are alternately arranged in a second direction; the first direction and the second direction intersect;
the array substrate further comprises conductive patterns; the conductive patterns include a pattern in the pixel driving circuit that is located in a different layer from the conductive connection pattern;
a value of a capacitance created between a conductive connection pattern and a conductive pattern in at least one pixel driving circuit in an odd-numbered row circuit group is less than a value of a capacitance created between a conductive connection pattern and a conductive pattern in at least one pixel driving circuit in an even-numbered row circuit group.

18. The array substrate according to claim 17, wherein a material of an insulating layer between the conductive connection pattern and the conductive pattern in the at least one pixel driving circuit in the odd-numbered row circuit group is the same as a material of an insulating layer between the conductive connection pattern and the conductive pattern in the at least one pixel driving circuit in the even-numbered row circuit group.

19. The array substrate according to claim 17, wherein an insulating layer between the conductive connection pattern and the conductive pattern in the at least one pixel driving circuit in the odd-numbered row circuit group and an insulating layer between the conductive connection pattern and the conductive pattern in the at least one pixel driving circuit in the even-numbered row circuit group include at least one insulating layer of a same material.

20. A display device, comprising the array substrate according to claim 17.

* * * * *